(12) United States Patent
Rinaldi et al.

(10) Patent No.: US 10,447,234 B2
(45) Date of Patent: Oct. 15, 2019

(54) PIEZOELECTRIC MEMS RESONATOR WITH INTEGRATED PHASE CHANGE MATERIAL SWITCHES

(71) Applicant: Northeastern University, Boston, MA (US)

(72) Inventors: Matteo Rinaldi, Boston, MA (US); Gwendolyn Hummel, Weymouth, MA (US)

(73) Assignee: Northeastern University, Boston, MA (US)

( * ) Notice: Subject to any disclaimer, the term of this patent is extended or adjusted under 35 U.S.C. 154(b) by 412 days.

(21) Appl. No.: 15/304,919

(22) PCT Filed: Apr. 17, 2015

(86) PCT No.: PCT/US2015/026480
§ 371 (c)(1),
(2) Date: Oct. 18, 2016

(87) PCT Pub. No.: WO2015/161257
PCT Pub. Date: Oct. 22, 2015

(65) Prior Publication Data
US 2017/0187347 A1   Jun. 29, 2017

Related U.S. Application Data

(60) Provisional application No. 61/981,526, filed on Apr. 18, 2014.

(51) Int. Cl.
*H01L 41/047*   (2006.01)
*H03H 9/13*   (2006.01)
(Continued)

(52) U.S. Cl.
CPC ............ *H03H 9/133* (2013.01); *H01L 41/18* (2013.01); *H01L 45/06* (2013.01); *H01L 45/141* (2013.01);
(Continued)

(58) Field of Classification Search
CPC ........ H03H 9/133; H03H 3/0073; H03H 3/02; H03H 9/02228; H03H 9/131; H03H 9/205;
(Continued)

(56) References Cited

U.S. PATENT DOCUMENTS

2003/0127944 A1   7/2003   Clark et al.
2005/0030800 A1   2/2005   Johnson et al.
(Continued)

OTHER PUBLICATIONS

S. Gong, et al., "Large Frequency Tuning of Lithium Niobate Laterally Vibrating MEMS Resonators Via Electric Boundary Reconfiguration", IEEE 2013 Transducers & Eurosensors XXVII, Jun. 16, 2013, pp. 2465-2468.
(Continued)

*Primary Examiner* — Thomas M Dougherty
(74) *Attorney, Agent, or Firm* — Verrill Dana LLP

(57) ABSTRACT

A monolithic integration of phase change material (PCM) switches with a MEMS resonator is provided to implement switching and reconfiguration functionalities. MEMS resonator includes a piezoelectric material to control terminal connections to the electrodes. The PCM is operable between an ON state and an OFF state by application of heat, which causes the phase change material to change from an amorphous state to a crystalline state or from a crystalline state to an amorphous state, the amorphous state and the crystalline state each associated with one of the ON state and the OFF state. A method of fabricating the MEMS resonator with
(Continued)

phase change material is provided. A reconfigurable filter system using the MEMS resonators is also provided.

20 Claims, 26 Drawing Sheets

(51) Int. Cl.
| | |
|---|---|
| *H03H 3/02* | (2006.01) |
| *H03H 9/02* | (2006.01) |
| *H01L 45/00* | (2006.01) |
| *H01L 41/18* | (2006.01) |
| *H03H 3/007* | (2006.01) |
| *H03H 9/205* | (2006.01) |
| *H03H 9/54* | (2006.01) |
| *H03H 9/15* | (2006.01) |

(52) U.S. Cl.
CPC ......... *H01L 45/144* (2013.01); *H03H 3/0073* (2013.01); *H03H 3/02* (2013.01); *H03H 9/02228* (2013.01); *H03H 9/131* (2013.01); *H03H 9/205* (2013.01); *H03H 9/54* (2013.01); *H03H 2003/027* (2013.01); *H03H 2009/155* (2013.01)

(58) Field of Classification Search
CPC ........... H03H 9/54; H01L 41/18; H01L 45/06; H01L 45/141; H01L 45/144
USPC ......... 310/313 A, 313 R, 318, 328, 365, 366
See application file for complete search history.

(56) References Cited

U.S. PATENT DOCUMENTS

| | | |
|---|---|---|
| 2006/0049389 A1 | 3/2006 | Lankhorst et al. |
| 2007/0099405 A1 | 5/2007 | Oliva et al. |
| 2007/0164839 A1 | 7/2007 | Naito |
| 2007/0235784 A1 | 10/2007 | Krusin-Elbaum et al. |
| 2008/0165569 A1 | 7/2008 | Chen et al. |
| 2010/0108977 A1 | 5/2010 | Yoon et al. |
| 2010/0309714 A1* | 12/2010 | Meade ............... G11C 13/0004 365/163 |
| 2011/0012696 A1 | 1/2011 | Skarp |
| 2011/0205030 A1 | 8/2011 | Amtmann et al. |
| 2011/0304404 A1 | 12/2011 | Gokirmak et al. |
| 2012/0147666 A1 | 6/2012 | Dubourdieu et al. |

OTHER PUBLICATIONS

E.K. Chua, et al., "Low resistance, high dynamic range reconfigurable phase change switch for radio frequency applications", Applied Physics Letters, (2010), vol. 97, No. 18, pp. 183506-1-183506-3.

Y. Shim, et al., "RF Switches Using Phase Change Materials", 2013 IEEE 26th International Conference on MEMS, Jan. 20, 2013, pp. 237-240.

C.-Y. Wen, et al., "A Phase-change via-Reconfigurable On-Chip Inductor", IEEE International Electron Devices Meeting (IEDM), Dec. 2010, pp. 10.3.1-10.3.4.

J.H. Kuypers, et al., "Green's Function Analysis of Lamb Wave Resonators", IEEE Ultrasonics Symposium, Nov. 2, 2008, pp. 1548-1551.

C.D. Nordquist, et al., "On/Off Micro-electromechanical Switching of AlN Piezoelectric Resonators", IEEE—MTTS International Microwave Symposium, Jun. 2, 2013, pp. 1-4.

S. Gong, et al., "Laterally Vibrating Lithium Niobate MEMS Resonators with High Electromechanical Coupling and Quality Factor", 2012 IEEE International Ultrasonics Symposium Proceedings, (2012), pp. 1051-1054.

B. L. Danner, et al., "Characterizing Metal-Insulator-Transition (MIT) Phase Change Materials (PCM) for RF and DC Microswitching Elements", Procedia Engineering, (2012), vol. 47, pp. 80-83.

D. Bouyge, et al., "Reconfigurable Bandpass Filter Based on Split Ring Resonators and Vanadium Dioxide (VO2) Microwave Switches", AMPC Microwave Conference, Asia Pacific, (2009), pp. 2332-2335.

* cited by examiner

PIEZOELECTRIC MEMS RESONATOR WITH INTEGRATED PHASE CHANGE MATERIAL SWITCHES

CROSS REFERENCE TO RELATED APPLICATIONS

This application claims the priority of U.S. Provisional Application No. 61/981,526 filed on Apr. 18, 2014, entitled "Piezoelectric MEMS Resonator Technology with Integrated Phase Change Material Switches," the disclosure of which is hereby incorporated by reference.

STATEMENT REGARDING FEDERALLY SPONSORED RESEARCH OR DEVELOPMENT

This invention was made with government support under Grant No. N66001-14-1-4011 awarded by the Department of Defense/Defense Advanced Research Projects Agency (DARPA). The government has certain rights in the invention.

BACKGROUND

Phase change materials (PCM) are chalcogenide materials that show a significant change in resistivity between the amorphous (OFF) and crystalline (ON) states. The PCM can change from one phase to another by application of heat. Reversible switching behavior can be achieved by applying low voltage pulses of proper duration (direct heating) across the PCM. Due to this property, PCMs have been investigated for use as Radio frequency (RF) switches and have been incorporated in the design of reconfigurable RF components such as inductors. Phase change chalcogenide compounds have been used in rewritable optical disks and other memory devices.

In recent years the demand for highly reconfigurable radio frequency (RF) systems, capable of operating in the severely crowded and rapidly changing modern commercial and military spectral environment, at a reduced overall component count and with a reduced development cost compared to conventional multi-band radios, has been steadily growing. In this context, the implementation of high quality factor, Q, micro acoustic resonators with monolithically integrated switching and frequency reconfiguration functionalities could dramatically reduce loss associated with the filtering element enabling new radio architectures with enhanced spectrum coverage, whose implementation is currently prevented by the lack of such high performance and intrinsically reconfigurable components.

High Q MEMS resonant devices enable the implementation of low insertion loss filters in a very small form factor. Different MEMS resonator technologies based on electrostatic or piezoelectric transduction have been investigated. Among these, the piezoelectric aluminum nitride (AlN) contour-mode resonator (CMR) technology has emerged as a promising solution in enabling the fabrication of multiple frequency and high performance resonators on the same silicon chip. Nevertheless, the current filtering solutions based on AlN micro acoustic resonant devices cannot be dynamically reconfigured to operate at different frequencies, orders, and bandwidths.

SUMMARY OF THE INVENTION

The invention relates to a micro-electro-mechanical system (MEMS) device, such as an RF resonator that produces a stable frequency that integrates piezoelectric and phase change materials. By incorporating monolithically integrated switching and reconfiguration functionalities, the MEMS device can address the demand for highly reconfigurable radio frequency (RF) systems, capable of operating in the severely crowded and rapidly changing modern commercial and military spectral environment, at a reduced overall component count and with a reduced development cost compared to conventional multi-band radios.

In one embodiment, a micro-electro-mechanical system (MEMS) resonator is provided, comprising:

a substrate, a first electrode supported by the substrate, a second electrode supported by the substrate, and terminal connections to the first electrode and the second electrode;

a piezoelectric material between the first electrode and the second electrode; and a phase change material disposed to control the terminal connections to the electrodes, and comprising one or more switches operable between an ON state and an OFF state;

wherein application of heat to the phase change material causes the phase change material to change from an amorphous state to a crystalline state or from a crystalline state to an amorphous state, the amorphous state and the crystalline state each associated with one of the ON state and the OFF state.

In one aspect of the MEMS resonator, the first electrode comprises a top electrode supported from an anchor region above a cavity in the substrate, and a second electrode comprises a top electrode supported and spaced from the first electrode, the top electrode comprising a plurality of fingers, and the phase change material comprises a plurality of switches, each switch associated with one of the fingers of the top electrode.

In a further aspect of the MEMS resonator, the phase change material is disposed to control connections between the first electrode and the second electrode.

In a further aspect of the MEMS resonator, the phase change material comprises one or more vias between the first electrode and the fingers of the second electrode.

In a further aspect of the MEMS resonator, the phase change material is disposed to control connections within a layer by bridging a gap between electrodes.

In a further aspect of the MEMS resonator, each switch is operable to turn ON upon application of a first voltage pulse having a first voltage and a first duration and is operable to turn OFF upon application of second voltage pulse having a second voltage and a second duration, the second voltage greater than the first voltage and the second duration shorter than the first duration.

In a further aspect of the MEMS resonator, each switch is independently operable to change from the amorphous state to the crystalline state or from the crystalline state to the amorphous state.

In a further aspect of the MEMS resonator, the switches are independently programmable to enable frequency programming of the MEMS resonator.

In a further aspect of the MEMS resonator, the switches are independently programmable to enable capacitance tuning of the MEMS resonator.

In a further aspect of the MEMS resonator, the switches are independently programmable to enable shorting of the resonator.

In a further aspect of the MEMS resonator, the switches are independently programmable to enable ON/OFF switching of the MEMS resonator.

In a further aspect of the MEMS resonator, each switch is in electrical communication with terminals for electrical connection to a voltage source and ground, whereby voltage pulses can be applied to each switch to affect a phase change from the amorphous state to the crystalline state or from the crystalline state to the amorphous state.

In a further aspect of the MEMS resonator, each switch is operable by laser to affect a phase change from the amorphous state to the crystalline state or from the crystalline state to the amorphous state.

In a further aspect of the MEMS resonator, each switch is operable by pressure to affect a phase change from the amorphous state to the crystalline state or from the crystalline state to the amorphous state.

In a further aspect of the MEMS resonator, each switch is in electrical communication between radio frequency signal electrodes, with an external heater in electrical communication with the terminal connections for electrical connection to a voltage source and ground, whereby voltage pulses applied to the external heater transfer heat to each switch to affect a phase change from the amorphous state to the crystalline state or from the crystalline state to the amorphous state.

In a further aspect of the MEMS resonator, the voltage pulses range from 0.01 to 25 V.

In a further aspect of the MEMS resonator, the phase change material comprises germanium telluride.

In a further aspect of the MEMS resonator, the phase change material comprises $Ge_{50}Te_{50}$.

In a further aspect of the MEMS resonator, the phase change material comprises a chalcogenide material.

In a further aspect of the MEMS resonator, the phase change material comprises Germanium Telluride, Germanium Antimony Telluride, Pyrite, Calaverite, Arsenic Sulfide, Germanium Sulfide, Silver Indium Antimony Telluride, Indium Selenide, Antimony Selenide, Indium Antimony Selenide, Indium Antimony Telluride, Germanium Antimony Selenide, Tellurium Arsenic Silicon Germanium, Germanium Antimony, Antimony Telluride, Germanium Telluride-Bismuth Telluride, Tellurium Antimony, Tellurium Germanium Tin, Tellurium Germanium Tin Gold, Molybdenum Sulfide, Arsenic Tellurium Iodide, Germanium Arsenic, Arsenic Selenide, Germanium Arsenic Selenide, Germanium Selenide, Tellurium Germanium Antimony Sulfide, Germanium Indium Tin Antimony, Silver Antimony Telluride, Indium Antimony, Gallium Antimony Telluride, Tin Antimony Telluride, Silver Antimony Sulfide, Telluride Germanium Tin Oxide, Tellurium Tin Selenide, Tellurium Selenium Gallium, Bismuth Selenide Antimony, Tellurium Germanium Tin Lead, Indium Selenium Tellurium Cobalt, Antimony Tellurium Bismuth Selenide, Germanium Antimony Telluride Cobalt, Germanium Antimony Tellurium Lead, Germanium Antimony Tellurium Nitride, Germanium Antimony Tellurium Silver, Arsenic Sulfur Selenide, Germanium Sulfur Selenide, Germanium Selenium Telluride, Arsenic Telluride, Silver Zinc, Germanium Tellurium Tin, or Antimony Selenium Telluride.

In a further aspect of the MEMS resonator, the piezoelectric material comprises aluminum nitride.

In a further aspect of the MEMS resonator, the piezoelectric material comprises Aluminum Nitride, Gallium Nitride, Aluminum Scandium Nitride, Aluminum Magnesium Nitride, Gallium Arsenide, Lead Zirconium Titanium Oxide, Lead Zirconium Titanium, Molybdenum Sulfide, Aluminum Zirconium Magnesium Nitride, Aluminum Erbium Magnesium Nitride, Quartz, Silicon Oxide, Ammonium, Potassium Hydrogen Phosphate, Rochelle Salt, Lithium Niobate, Silicon Selenite, Germanium Selenite, Lithium Sulfate, Antimony Sulfoiodide, Barium Titanate, Calcium Barium Titanate, Lead Titanate Zirconate, Apatite, Bimorphs, Gallium Phosphate, Lanthanum Gallium Silicate, Lead Scandium Tantalate, Lithium Tantalate, Polyvinylidene Fluoride, Potassium Sodium Tartrate, Lead Lanthanum Zirconate Titanate, Lead Magnesium Niobate, Lithium Nibonate, Lead Titanate, or Zinc Oxide.

In a further aspect of the MEMS resonator, an insulating material is provided between the piezoelectric material and the phase change material.

In a further aspect of the MEMS resonator, an insulating material is provided between the phase change material and an external heater.

In another embodiment, a method of fabricating a MEMS resonator is provided, comprising:
 providing a semiconductor substrate;
 forming a bottom electrode comprising a metal layer supported above the substrate;
 forming a resonant body comprising a piezoelectric material over the bottom electrode;
 providing a phase change material over the resonant body; and
 forming a top electrode comprising a metal material over the at least one via.

In another aspect of the method, the phase change material is provided by sputtering.

In a further aspect of the method, the phase change material is provided by pulsed DC sputtering or RF sputtering.

In a further aspect of the method, the phase change material is provided by forming a via above the piezoelectric material.

In a further aspect of the method, the phase change material is provided by sputtering on top of an insulating material.

In a further aspect of the method, the insulating material is placed on top of an external heater.

In a further embodiment, a reconfigurable filter system is provided comprising a piezoelectric MEMS resonator with integrated phase change material, wherein at least one of frequency, impedance, capacitance, bandwidth, roll-off, and band selection of the filter system can be reconfigured by operation of the MEMS resonator.

In a further embodiment, a reconfigurable filter system comprises a plurality of piezoelectric MEMS resonators with integrated phase change material, wherein at least one of frequency, impedance, capacitance, bandwidth, roll-off, and band selection of the filter system can be reconfigured by operation of one or more of the MEMS resonators.

DESCRIPTION OF THE DRAWINGS

The invention will be more fully understood from the following detailed description taken in conjunction with the accompanying drawings in which.

DETAILED DESCRIPTION OF THE INVENTION

Figure 1:
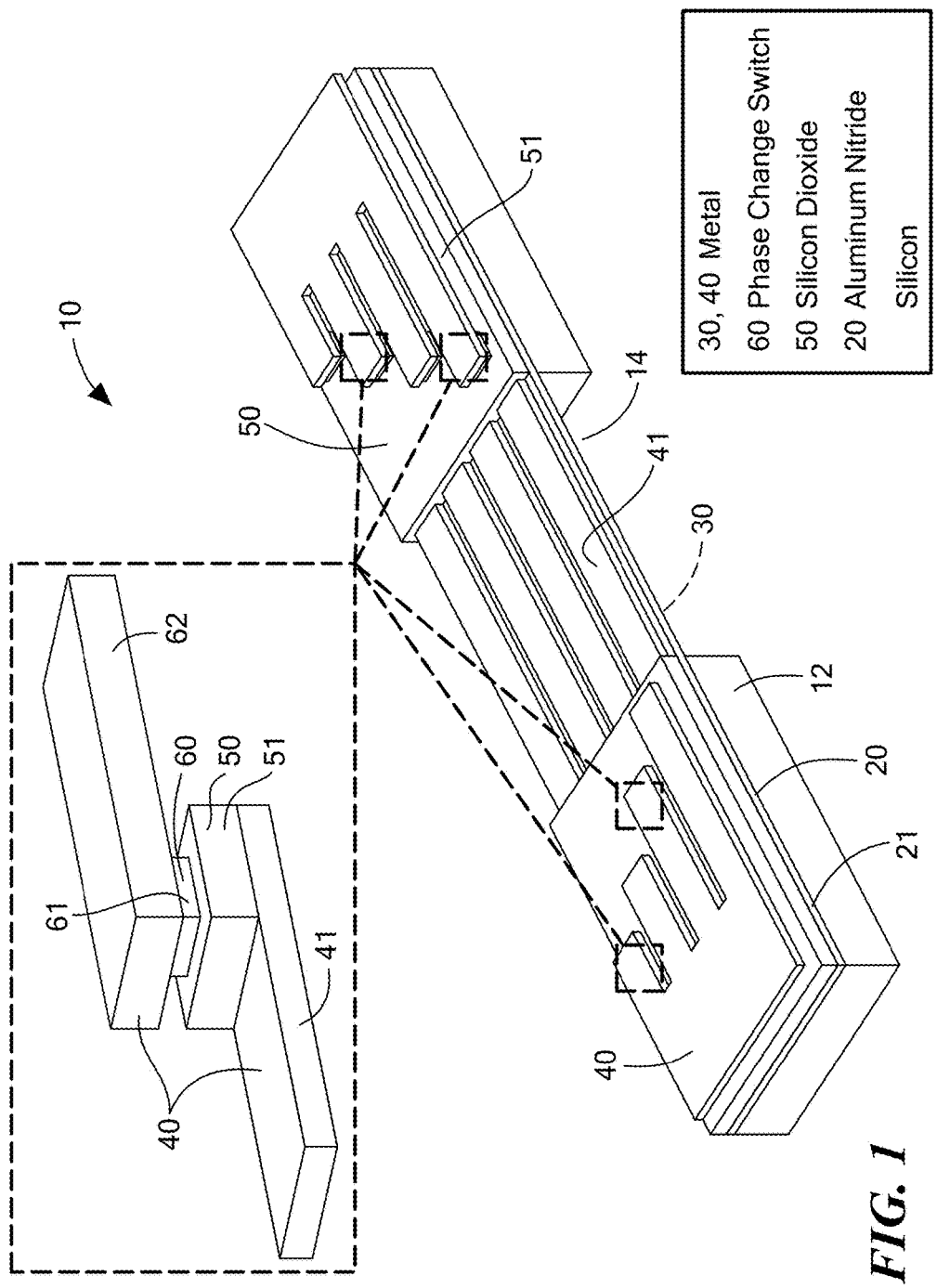
FIG. 1 is a three-dimensional (3D) representation of an embodiment of a switchable and reconfigurable resonator with an exploded view of an individual PCM via switch.

The disclosure of U.S. Provisional Application No. 61/981,526 filed on Apr. 18, 2014, entitled "Piezoelectric MEMS Resonator Technology with Integrated Phase Change Material Switches," is hereby incorporated by reference.

A reconfigurable piezoelectric micro-electro-mechanical system (MEMS) device using phase change material (PCM) based switchable electrodes is provided. The phase change material switches are integrated with piezoelectric MEMS resonator devices in the same design and fabrication process. Programming of the piezoelectric MEMS resonators can be done without additional RF elements such as capacitors and MEMS switches. A large ON/OFF ratio (~$10^7$) and low voltage needed for switching (for example, 1-2.5V, compared to 35-40 V) make phase change switches useful for integration with piezoelectric MEMS resonator technology. In some embodiments, the voltage for switching can range from 0.01 to 25 V. Heat can be applied directly, through joule heating activated by application of low voltage pulses, through indirect heating of an external heating element, through application of heat using a laser, or through pressure changes applied at the material. The device does not require any power to keep the switch in either the ON or OFF stage.

The integration and co-design of phase change switches and piezoelectric MEMS resonators allows the implementation of high performance MEMS resonators whose equivalent electrical impedance can be dynamically reconfigured, enabling intrinsic ON/OFF switching of the resonance and reconfiguration of the device electrical capacitance. This feature reduces the number of additional RF components required for the implementation of reconfigurable wireless communication devices, such as filters and frequency sources, based on architectures that require the use of resonators, switches, and reconfigurable capacitors. It allows the implementation of high performance MEMS resonators whose operating frequency can be dynamically reconfigured: an individual MEMS resonator can be dynamically reconfigured to operate at multiple frequencies, enabling the implementation of single chip, miniaturized, and high performance reconfigurable RF wireless communication devices, such as frequency sources and filters.

In one embodiment, a switch utilizes the phase change material Germanium Telluride ($Ge_{50}Te_{50}$), which is suitable for RF applications due to its low ON resistance (~2Ω), large ON/OFF ratio (~$10^7$), and low OFF capacitance (~20 fF), with piezoelectric MEMS resonators. These switches require a much simpler fabrication than the typical electromechanical switches and also require a lower voltage to program (for example, 1-2.5V compared to 35-40V for electromechanical switches). These features of the phase change material make it suitable for integration with piezoelectric MEMS resonators.

Other phase change materials, and in particular other chalcogenides, could be used. Examples of phase change materials include, without limitation, Germanium Telluride, Germanium Antimony Telluride, Pyrite, Calaverite, Arsenic Sulfide, Germanium Sulfide, Silver Indium Antimony Telluride, Indium Selenide, Antimony Selenide, Indium Antimony Selenide, Indium Antimony Telluride, Germanium Antimony Selenide, Tellurium Arsenic Silicon Germanium, Germanium Antimony, Antimony Telluride, Germanium Telluride-Bismuth Telluride, Tellurium Antimony, Tellurium Germanium Tin, Tellurium Germanium Tin Gold, Molybdenum Sulfide, Arsenic Tellurium Iodide, Germanium Arsenic, Arsenic Selenide, Germanium Arsenic Selenide, Germanium Selenide, Tellurium Germanium Antimony Sulfide, Germanium Indium Tin Antimony, Silver Antimony Telluride, Indium Antimony, Gallium Antimony Telluride, Tin Antimony Telluride, Silver Antimony Sulfide, Telluride Germanium Tin Oxide, Tellurium Tin Selenide, Tellurium Selenium Gallium, Bismuth Selenide Antimony, Tellurium Germanium Tin Lead, Indium Selenium Tellurium Cobalt, Antimony Tellurium Bismuth Selenide, Germanium Antimony Telluride Cobalt, Germanium Antimony Tellurium Lead, Germanium Antimony Tellurium Nitride, Germanium Antimony Tellurium Silver, Arsenic Sulfur Selenide, Germanium Sulfur Selenide, Germanium Selenium Telluride, Arsenic Telluride, Silver Zinc, Germanium Tellurium Tin, or Antimony Selenium Telluride.

In one embodiment, an aluminum nitride (AlN) piezoelectric Micro Electro Mechanical System (MEMS) resonator is provided using phase change material (PCM) programmable vias. Other piezoelectric materials in addition to AlN could be used. Examples of piezoelectric materials include, without limitation, Aluminum Nitride, Gallium Nitride, Aluminum Scandium Nitride, Aluminum Magnesium Nitride, Gallium Arsenide, Lead Zirconium Titanium Oxide, Lead Zirconium Titanium, Molybdenum Sulfide, Aluminum Zirconium Magnesium Nitride, Aluminum Erbium Magnesium Nitride, Quartz, Silicon Oxide, Ammonium, Potassium Hydrogen Phosphate, Rochelle Salt, Lithium Niobate, Silicon Selenite, Germanium Selenite, Lithium Sulfate, Antimony Sulfoiodide, Barium Titanate, Calcium Barium Titanate, Lead Titanate Zirconate, Apatite, Bimorphs, Gallium Phosphate, Lanthanum Gallium Silicate, Lead Scandium Tantalate, Lithium Tantalate, Polyvinylidene Fluoride, Potassium Sodium Tartrate, Lead Lanthanum Zirconate Titanate, Lead Magnesium Niobate, Lithium Nibonate, Lead Titanate, or Zinc Oxide.

Integrating a phase change material into a piezoelectric resonator allows for easier fabrication, as no micro or nano-scale gap is required. The integration of the phase change material technology and the piezoelectric MEMS resonator designs can be accomplished with as little as one additional mask step to add ON/OFF switching capability and capacitive tuning to the MEMS resonators. With several additional steps and some design alterations, the piezoelectric MEMS resonators can be monolithically integrated with the phase change material to create resonator designs and filter architectures that provide frequency programming, capacitive tuning, and ON/OFF switching for individual resonators, sections of filter banks, or entire filter banks.

The inclusion of the phase change material in the fabrication of piezoelectric MEMS resonators is fairly simple, as it just requires a deposition using a sputtering technique with RF source or DC source with pulse. The phase change material can then be patterned on the MEMS devices using lithography and liftoff or etching techniques. An insulation layer is provided to contain and protect the phase change material. The material used for this insulation layer is typically silicon dioxide ($SiO_2$), but other dielectric materials can be used (use of aluminum nitride is described in one of the prototypes discussed below).

Resonator designs can be adjusted to include vias between different metal layers or gaps in the metal lines of the same metal layer to incorporate the phase change material. Additionally, testing pads can be incorporated for source and ground for each switch. These pads can be used to impart the voltage pulses required to switch the phase change material between the crystalline and amorphous states. The number of testing pads required depends on the number of switches included in the design, which depends on the application of the device.

Several prototypes of this device have been fabricated integrating phase change switches with aluminum nitride (AlN) piezoelectric MEMS resonator technology. One prototype demonstrates frequency and capacitance tuning Another prototype demonstrates ON/OFF capabilities and capacitive tuning.

An embodiment of a MEMS resonator that has been fabricated is described with reference to FIG. 1. A static contour-mode resonator is composed of an AlN film 20 sandwiched between two metal electrodes 30, 40 (FIG. 1). In a conventional static contour mode resonator, when an alternating current (AC) signal is applied across the thickness T of the AlN film, a contour-extensional mode of vibration is excited through the equivalent $d_{31}$ piezoelectric coefficient of AlN. Given the equivalent mass density, $\rho_{eq}$, and Young's modulus, $E_{eq}$, of the material stack that forms the resonator, the center frequency, $f_o$, of this laterally vibrating mechanical structure is set by the period, W, of the interdigital electrode patterned on top of the AlN plate and can be approximately expressed as:

$$f_0 = \frac{1}{2W}\sqrt{\frac{E_{eq}}{\rho_{eq}}}$$

For a given geometry of the AlN resonant micro-plate and period of the interdigital electrode, the equivalent electrical impedance of the device is set by the number of metal fingers, n, composing the interdigital electrode 40. In particular, only the fraction of the device area covered by the metal fingers is effectively employed for transduction. Therefore, the device electrical static capacitance, $C_o$, and electromechanical coupling coefficient, $k_t^2$, are directly proportional to the number of metal fingers, n, composing the interdigital electrode employed to excite the higher order ($n^{th}$) contour-extensional mode of vibration in the AlN micro-plate.

In one embodiment, a MEMS resonator is provided that enables dynamic reconfiguration of the number of metal fingers composing the interdigital electrode employed to excite a higher order contour-extensional mode of vibration in an AlN resonant micro-plate. This resonator allows direct control and reconfigurability of the electrical coupling across the piezoelectric body of the device, enabling effective ON/OFF switching of the acoustic resonance (OFF state corresponding to n=0) and reconfiguration of the device electromechanical coupling coefficient and electrical static capacitance.

Figure 2:
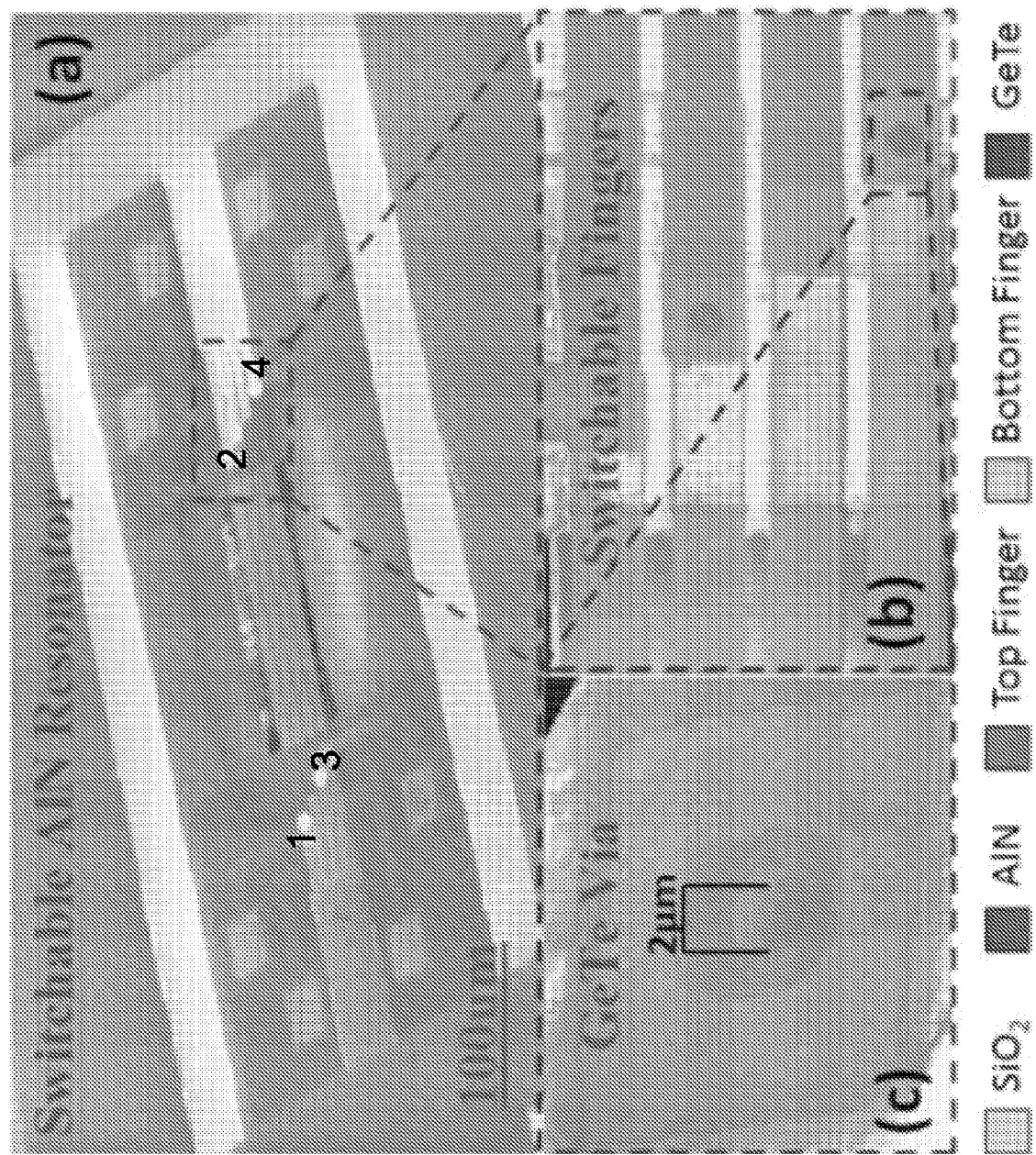
FIG. 2 is scanning electron microscope (SEM) images of (a) a switchable and reconfigurable resonator, (b) close-up of phase change switches integrated into the fingers of the resonator, and (c) individual PCM via switch.

The resonant core of this embodiment is composed of a 500 nm thick AlN layer 20 sandwiched between a bottom or first electrically floating plate electrode 30 and a top or second interdigital electrode 40 composed of n=4 metal fingers. Each metal finger completely or substantially completely covers the resonant body of the device extending up to the anchoring regions where it is overlapped by the electrical terminal of the resonator, but separated by a $SiO_2$ insulating layer 50. Four miniaturized (2×2 μm²) Phase Change Material (PCM) vias 60 are monolithically integrated with the resonant structure and employed as low loss radio frequency (RF) switches to connect each of the 4 metal fingers forming the device interdigital electrode to the electrical terminals of the resonator through the $SiO_2$ insulating layer (FIGS. 1, 2). In this embodiment, $Ge_{50}Te_{50}$ is chosen to implement the PCM via switches due to its high ON/OFF ratio and low loss at radio frequencies. The transition temperature (ON/OFF switching) of each PCM via is readily reached by passing current through the PC material itself (direct heating).

Figure 3A:
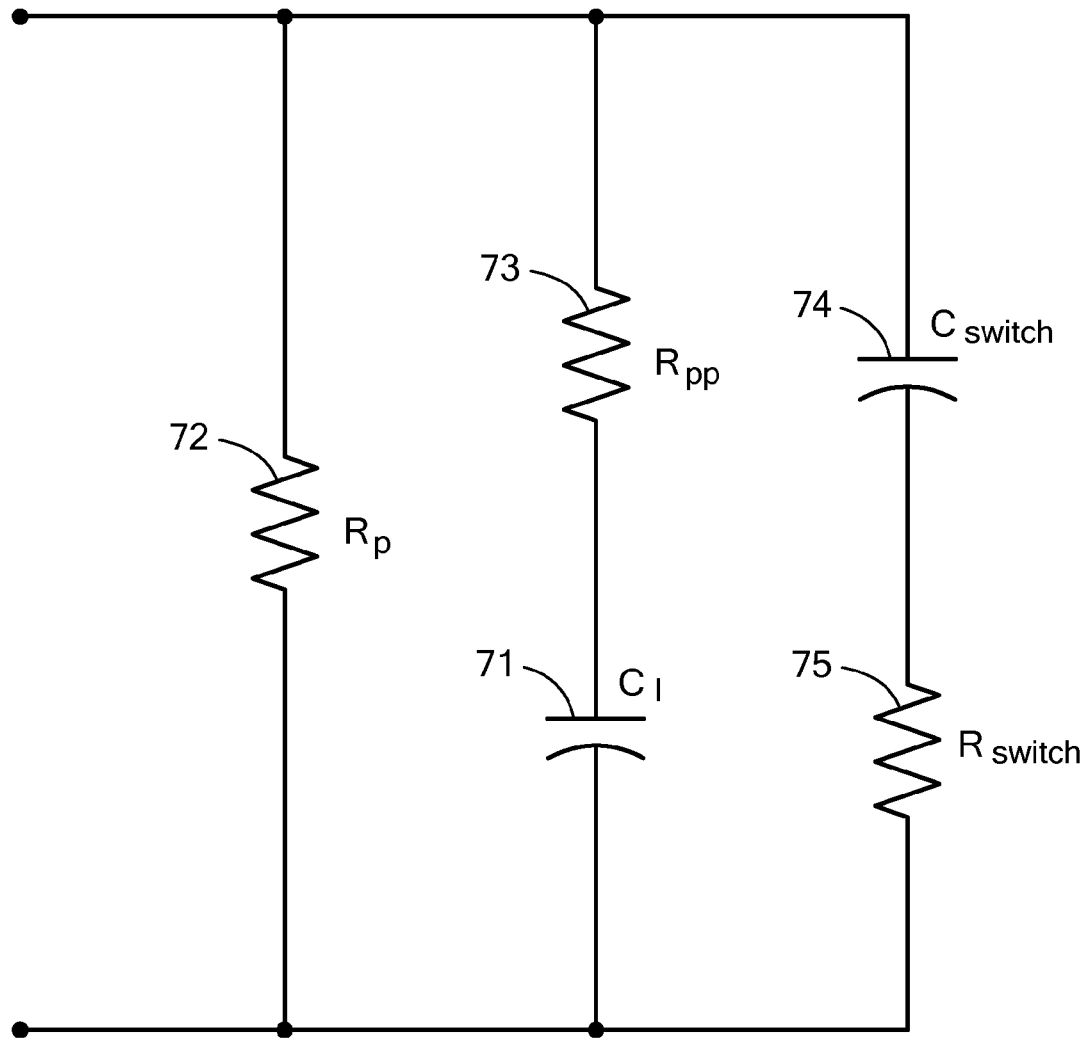
FIG. 3 is an illustration of an equivalent circuit model of the resonator of FIG. 1 in the (a) OFF state, and (b) State 1 and State 2. $C_p$, $R_p$, and $R_{pp}$, represent the parasitics. $C_{switch}$ and $R_{switch}$ are the capacitance/resistance associated with the combination of PCM via switches in the OFF state. $R_s$ is the loss introduced by the combination of PCM vias in the ON state. Note that $R_s$ has minimal effect on resonator performance. $C_o$ and $R_{Op}$ are static capacitance/resistance of the piezoelectric transducer. $R_m$, $C_m$, and $L_m$ represent the motional branch of the resonator. All values used for these equivalent circuit elements are reported in Table 1.

When all the vias are in the OFF state, the terminals of the device are ideally completely isolated (open circuit) and no electric field is coupled across the piezoelectric material (hence no resonance is excited). In practice, a high impedance path between the two terminals is formed through substrate parasitics ($C_r$, $R_p$, $R_{pp}$) and the capacitance and resistance associated with the combination of PCM via switches in the OFF state ($C_{switch}$, $R_{switch}$) (FIG. 3(a)).

When two vias (i.e. vias 1 and 4 in FIG. 2) are in the ON state (State 1), only two fingers are connected to form the interdigital electrode with a polarity that uniquely matches the one of the strain field for the $4^{th}$ order contour-extensional mode of vibration of the plate. Therefore, a $4^{th}$ order contour-extensional mode of vibration is excited in the AlN micro-plate by means of a lateral field excitation scheme. Such configuration results in a relatively high impedance resonance due to the low values of device static capacitance, $C_o$, and electromechanical coupling coefficient, $k_t^2$, associated with the 2-finger top interdigital electrode configuration for which only a fraction of the device area (the one covered by the two metal fingers) is effectively employed for transduction.

When three vias (i.e. vias 1, 3, and 4 in FIG. 2) are in the ON state (corresponding to a 3-finger interdigital electrode configuration), the effective transduction area for $4^{th}$ order contour-extensional mode of vibration is increased resulting in larger values of device static capacitance, $C_o$, and electromechanical coupling coefficient, $k_t^2$, hence, lower impedance resonance. Maximum transduction area, $C_o$, and $k_t^2$, hence minimum impedance resonance, are achieved when all 4 vias are in the ON state, forming a 4-finger interdigital electrode with a polarity that uniquely matches the one of the strain field for the $4^{th}$ order contour-extensional mode of vibration of the plate. The values of $C_o$ and $k_t^2$, estimated by Finite Element Method (FEM) simulation using COMSOL Multiphysics, for the four possible device configurations are reported in FIG. 4.

Figure 5:
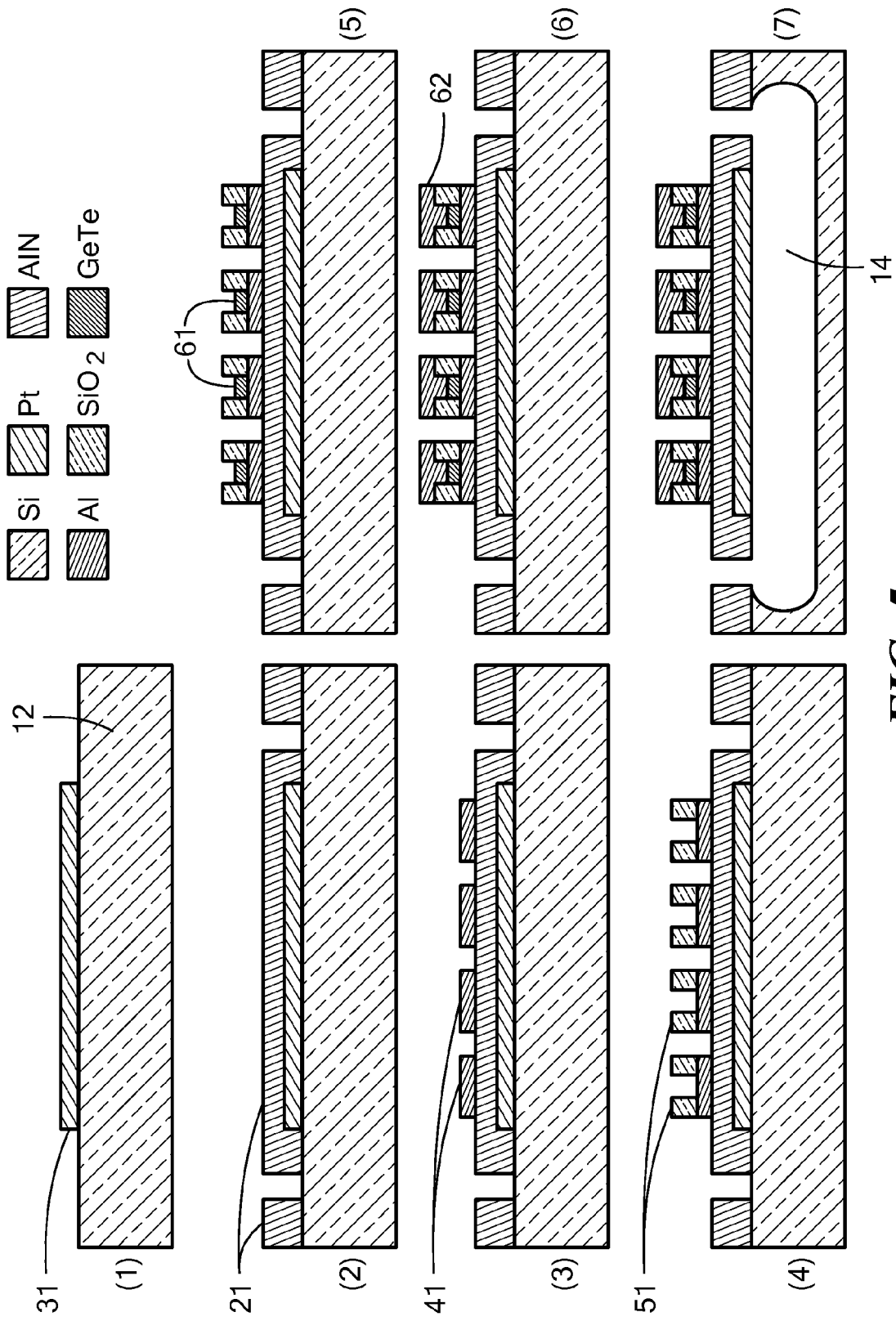
FIG. 5 is a schematic illustration of an embodiment of a fabrication process for the resonator of FIG. 1 in which (1) platinum electrode, (2) aluminum nitride deposition and etch, (3) aluminum fingers, (4) PECVD oxide deposition and etch, (5) Phase change material deposition, (6) Top aluminum contact, (7) $XeF_2$ release.

A switchable resonator according to this embodiment was fabricated using a relatively simple 6-mask post-CMOS compatible fabrication process, as shown in FIG. 5.

This fabrication process began with a high resistivity Si substrate 12 (resistivity >10,000 Ω·cm). (1) A 5 nm/95 nm Titanium/Platinum (Ti/Pt) layer 31 was sputter deposited and patterned with a lift-off process to form the bottom electrically floating electrode. (2) Next, a high quality c-axis oriented 500 nm aluminum nitride (AlN) layer 21 was sputter deposited on top of the Ti/Pt layer. Inductively Coupled Plasma (ICP) etching in $Cl_2$ based chemistry was used to open vias to the bottom Pt and define the dimensions of the micro-plate resonator. (3) Next, sputter deposition was used to deposit a 100 nm layer of aluminum (Al) 41 which was patterned using lift-off to create the interdigital electrodes on top of the AlN micro-plate. (4) Plasma Enhanced Chemical Vapor Deposition (PECVD) was used to deposit 300 nm of $SiO_2$ 51 to form the insulation layer for the PCM switches. 2×2 μm² vias were etched in the $SiO_2$ using ICP with $CHF_3$ based chemistry. (5) DC Pulse Sputtering was used to deposit 100 nm/10 nm of $Ge_{50}Te_5$/Ti 61 in the vias and pattern using a lift-off process. (6) A 100 nm Al film 62 was deposited using sputter and patterned with lift-off to form the top probing pad and the top electrode of the PCM switches. (7) Finally, Xenon Difluoride ($XeF_2$) isotropic etching was used to etch the Si substrate and create an air gap 14 or cavity under the resonator, completely releasing the resonant structure.

Figure 6:
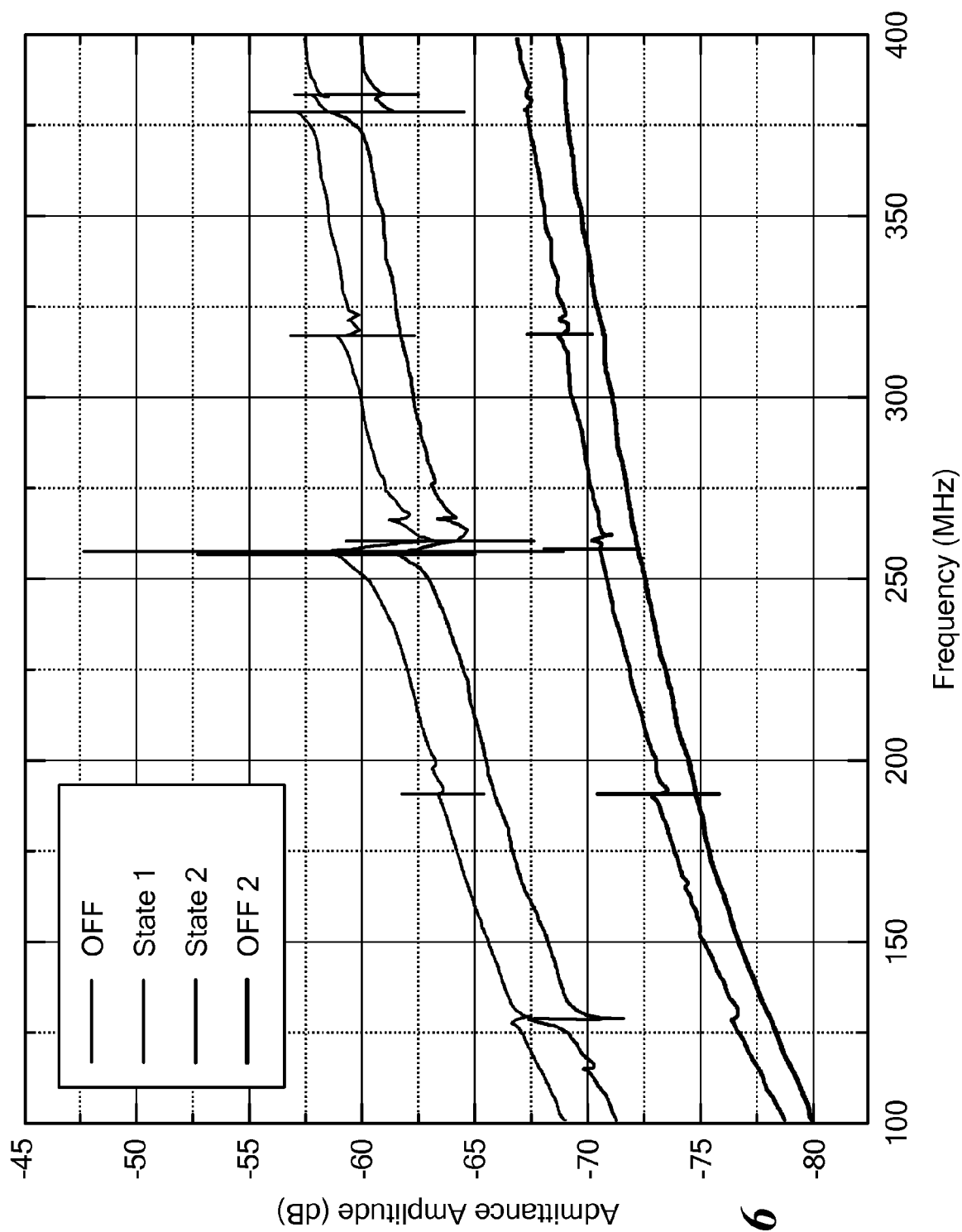
FIG. 6 is a graph of measured admittance of the resonator of FIG. 1 in the OFF state (all the PCM vias OFF); State 1 (vias 1 and 4 ON); State 2 (all the vias ON); OFF 2 (all the vias OFF again). The difference between OFF and OFF 2 is believed to be due to imperfect reamorphization of the PCM vias. In State 2, via 2 functioned imperfectly, connecting the metal finger to the terminal with a resistance of ~140 MΩ. Therefore, only 3 fingers were effectively connected to form the interdigital electrode.

The electrical response of the fabricated switchable MEMS resonator was measured by an Agilent E5071C network analyzer after performing an open-short-load calibration on a standard substrate. The transition temperature, needed for ON/OFF switching of the PCM vias, was reached by passing current through the PC material itself (direct heating). ON state was achieved by applying a 300 μs pulse with amplitude of 1 V and a rise/fall time of 100 ns while the OFF state was achieved by applying a 4 μs pulse with amplitude of 2.5 V and a rise/fall time of 5 ns. The device was reconfigured to operate in 3 different states: OFF (all vias in the OFF state), State 1 (vias 1 and 4 in the ON state), and State 2 (all vias 1-4 in the ON state) (FIG. 6). Although all the PCM vias were turned ON in State 2, via 2 malfunctioned, showing a resistance of ~140 MΩ. Therefore, only 3 fingers (vias 1, 3, and 4) were effectively connected to form the interdigital electrode.

Figure 3B:
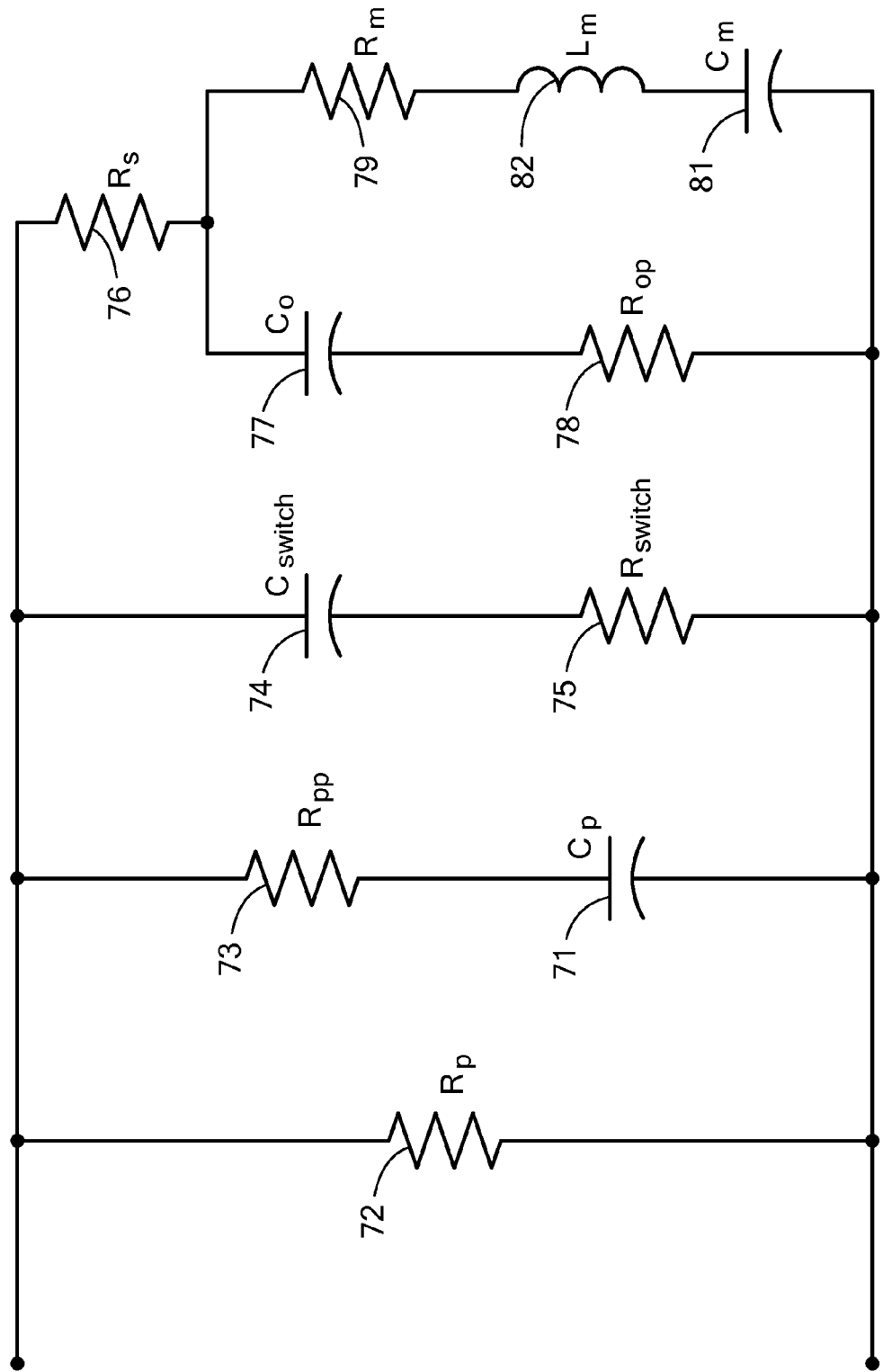
Figure 7:
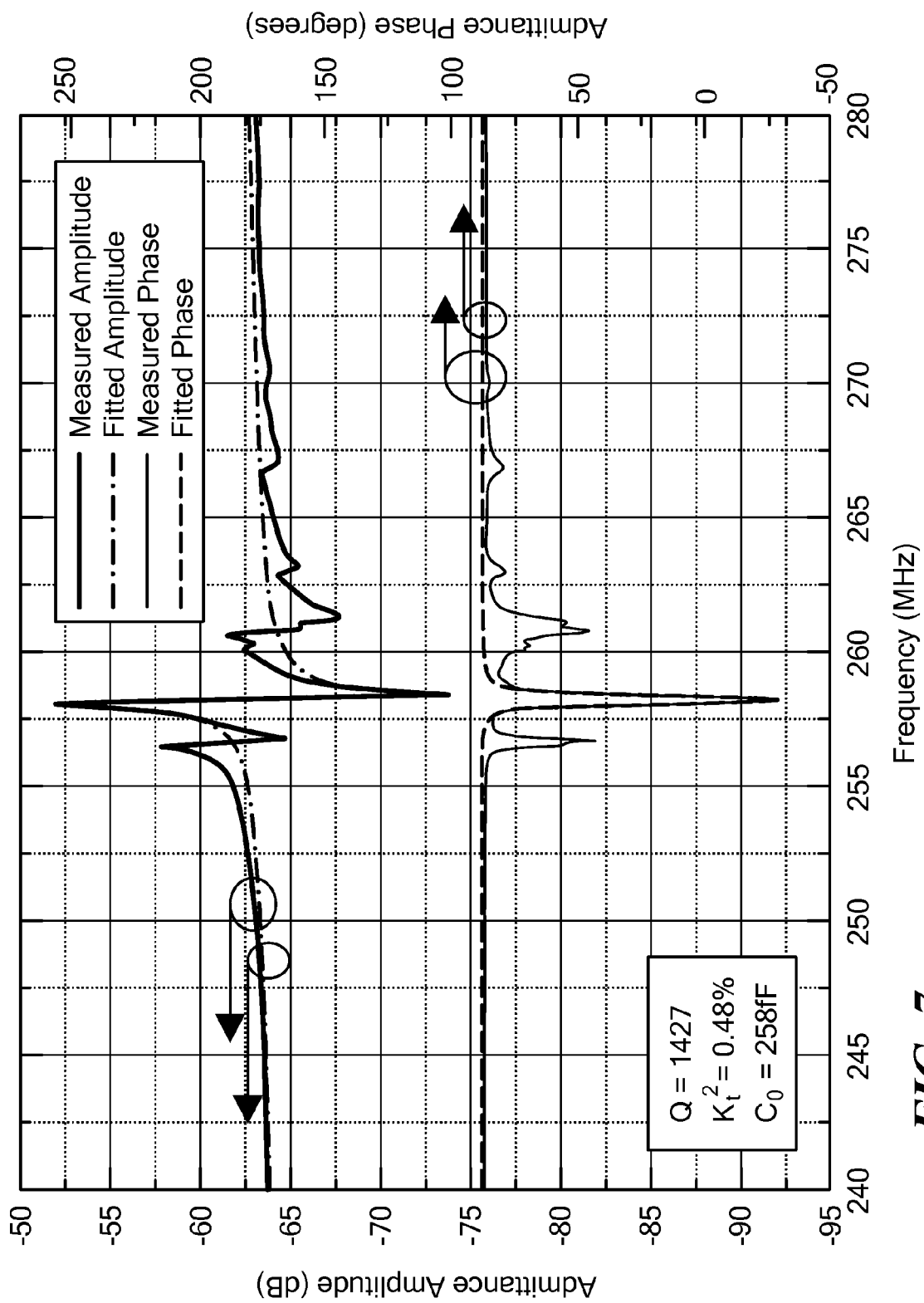
FIG. 7 is a graph of measured admittance and circuit model fitting (FIG. 3(b); Table 1) of the fabricated resonator of FIG. 1 with PCM vias 1 and 4 in the ON state (State 1).
Figure 8:
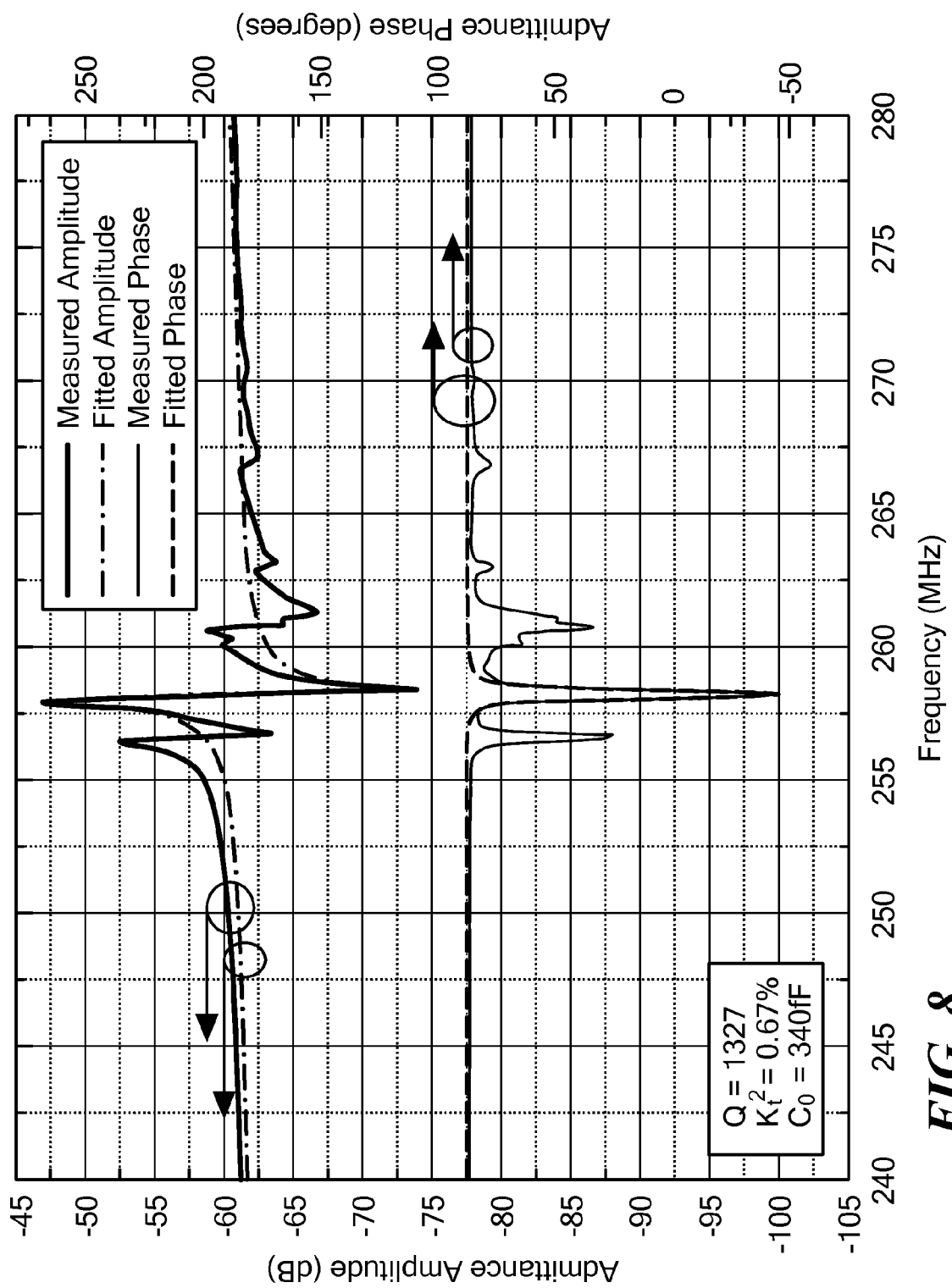
FIG. 8 is a graph of measured admittance and circuit model fitting (FIG. 3(b), Table 1) of the fabricated resonator of FIG. 1 with all 4 PCM vias in the ON state (State 2). Although all the PCM vias are turned ON, via 2 malfunctioned, showing a resistance of ~140 MΩ. Therefore, only 3 fingers are effectively connected to form the interdigital electrode.

The measured responses of the device in the 3 different states were fitted to the equivalent circuits in FIG. 3. The substrate parasitics ($C_p$ (71), $R_p$ (72), and $R_{pp}$ (73)) and the capacitance ($C_{switch}$ (74)) and resistance ($R_{switch}$ (75)), associated with the combination of PCM vias in the OFF state were extracted from the OFF state measurement (FIG. 3(*a*)) while the remaining equivalent circuit components were extracted from State 1 and State 2 measurements (FIG. 3(*b*)) (Being: $R_s$ (76)—the loss introduced by the combination of PCM vias in the ON state; $C_o$ (77) and $R_{0p}$ (78)—static capacitance and resistance of the piezoelectric transducer; and $R_m$, (79), $C_m$ (81), and $L_m$ (82)—the motional branch of the resonator). The results of the fitting procedure are reported in FIGS. 7-8 and Table 1.

| States | $R_m$ | $C_m$ | $L_m$ | $R_s$ | $R_{0p}$ | $C_0$ | $R_{switch}$ | $C_{switch}$ | $C_p$ | $R_{pp}$ | $R_p$ |
|---|---|---|---|---|---|---|---|---|---|---|---|
| OFF | — | — | — | — | — | — | 0Ω | 69.232 fF | 75.768 fF | 47.095 kΩ | 48.04 Ω |
| State 1 | 422.8Ω | 1.0102 fF | 376.48 μH | 5Ω | 5Ω | 258.17 fF | 5Ω | 86.092 fF | 75.768 fF | 47.095 kΩ | 48.04Ω |
| State 2 | 227.6Ω | 1.943 fF | 195.88 μH | 3.75Ω | 5Ω | 359.99 fF | 3.75 | 106.79 fF | 75.768 fF | 47.095 kΩ | 48.04Ω |

Equivalent Circuit Element Values

Values of OFF resistance larger than ~250 MΩ, ON resistance of ~5Ω (ON/OFF ratio of ~$10^7$) and OFF capacitance of ~40 fF, were extracted for the PCM vias.

Figure 4:
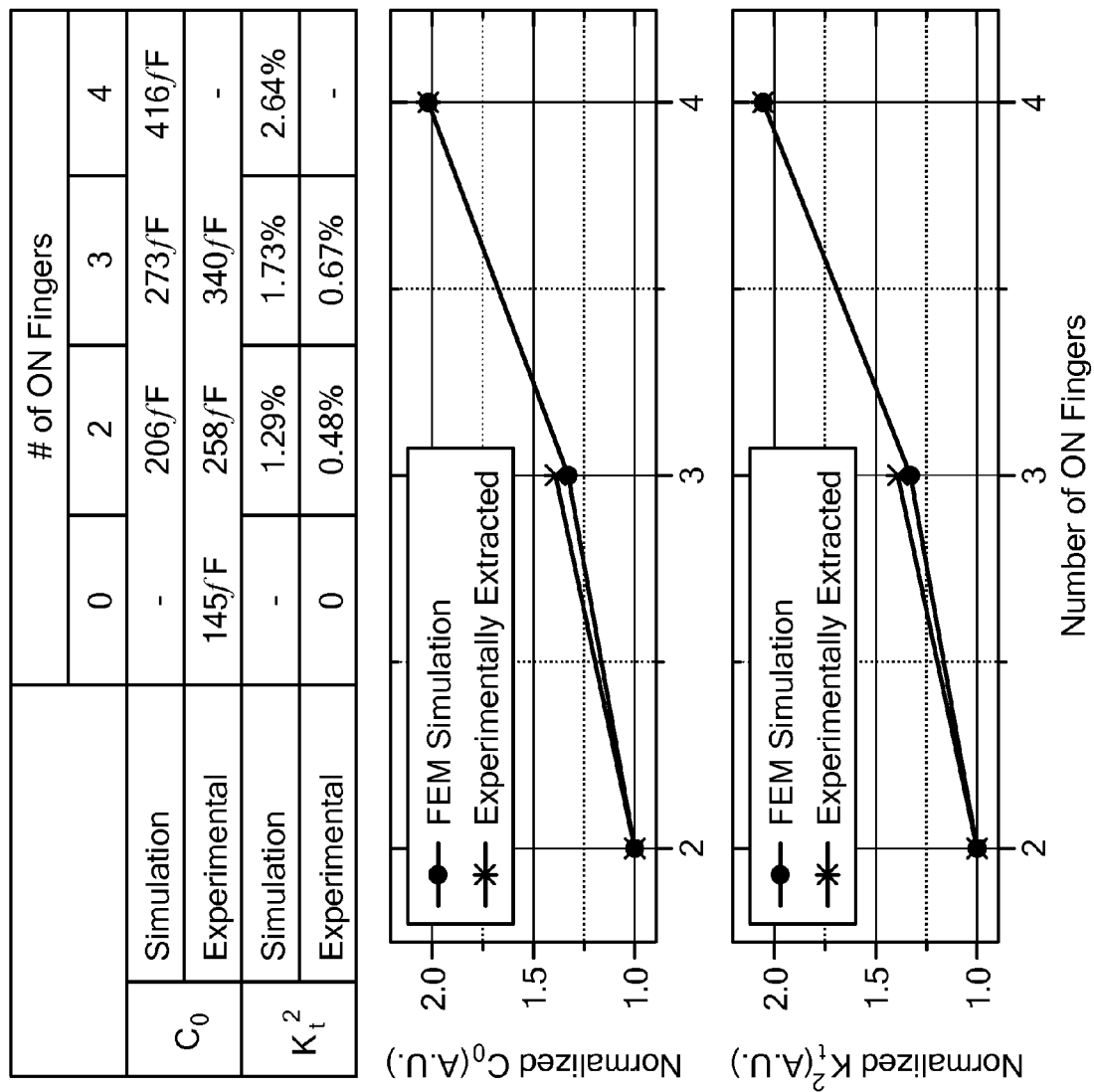
FIG. 4 is a comparison between Finite Element Method (FEM) simulated (COMSOL) and experimentally extracted values of $C_0$ and $k_t^2$ for the different possible device states.

The values of $C_o$ and $k_t^2$ extracted from the measurements for each possible device configuration were compared with the ones estimated by FEM simulations (FIG. 4). Although a slight difference in absolute values is observed due to imperfections in the model and material coefficients used in the simulation, the experimentally recorded relative variations of $C_o$ and $k_t^2$, for different configurations of the top electrode, closely match the ones achieved by FEM simulations.

These experimental results indicate that the integrated MEMS resonator enables not only effective ON/OFF switching of the acoustic resonance of the device (a high quality factor (Q>1300), 18× impedance variation at resonance, $C_{on}/C_{off}$~4 with parasitics, $C_{on}/C_{off}$~7 without parasitics), but also tunability of the electrical capacitance (258 fF<$C_o$<340 fF) and reconfiguration of the device electromechanical coupling (0%<$k_t^2$<0.7%) (FIGS. 4, 6-8, Table 1) which can lead to the implementation of filter architectures (exclusively based on AlN/PCM high performance resonators and capacitors) whose frequency, order, bandwidth, and roll-off can be dynamically reconfigured.

A further embodiment of a reconfigurable resonator prototype was fabricated by integrating two Ge$_{50}$Te$_{50}$ vias in the design of a 200 MHz contour-extensional mode resonator. The capability to reconfigure the device to operate in 3 different states, maintaining constant electromechanical performance (resonator figure of merit, FOM=$k_t^2 \cdot Q \approx 7$) was demonstrated: (1) High Impedance state (resonator static capacitance, $C_o \approx 660$ fF, motional resistance, $R_m \approx 225\Omega$), (2) Low Impedance state ($C_o \approx 1409$ fF; $R_m \approx 90\Omega$), and (3) Short state (the resonator is reconfigured into a short circuit).

Referring to FIGS. 9-12, the reconfigurable RF MEMS resonator presented in this embodiment includes an AlN thin-film (500 nm) sandwiched between a top aluminum (Al) interdigital electrode and a bottom platinum (Pt) plate electrode. The top electrode is directly connected to the two terminals of the resonator while the bottom metal plate is connected to each of the terminals through two independently programmable PCM vias (via 1 and via 2, FIG. 10). The PCM was employed for the implementation of ON/OFF RF switches connecting two metal electrodes through vias etched in an AlN thin film (typically SiO$_2$ is used as an insulator for PCM via switches). Ge$_{50}$Te$_{50}$ was chosen as the PCM for the programmable vias due to its high ON/OFF ratio and low loss at radio frequencies. FIGS. 11A and 11B are schematic illustrations of an embodiment of a fabrication process flow, in which (a) illustrates a cross section along the device width and (b) illustrates a cross section along the device length. FIGS. 11A and 11B illustrate the following steps: (1) deposition and lift-off of 100 nm Pt as bottom electrode 131; (2) sputter deposition of 500 nm AlN 121 and dry etch to form vias and resonator body; (3) DC pulse sputtering and lift-off of 100 nm PCM 161; (4) deposition and lift-off of 250 nm Al as top electrode 141; (5) release in XeF$_2$ to create cavity 114.

When both vias are in the OFF state, the bottom electrode is electrically isolated from the resonator terminal. A lateral field excitation (LFE) scheme (relatively low value of device static capacitance, $C_o$, hence high impedance resonance) is implemented by the bottom electrically floating plate and the top interdigital electrode (FIG. 12(*a*)). When only one of the vias is turned ON, the bottom electrode is connected to the corresponding resonator terminal. A thickness field excitation (TFE) scheme (relatively high value of device, Co, hence low impedance resonance) is implemented by the bottom electrode and the top finger electrodes connected to the opposite terminal (FIG. 12(*b*)). When both vias are turned ON, the bottom electrode electrically shorts the resonator terminals (the resonator is reconfigured into a short circuit) (FIG. 12(*c*)).

Figure 9:
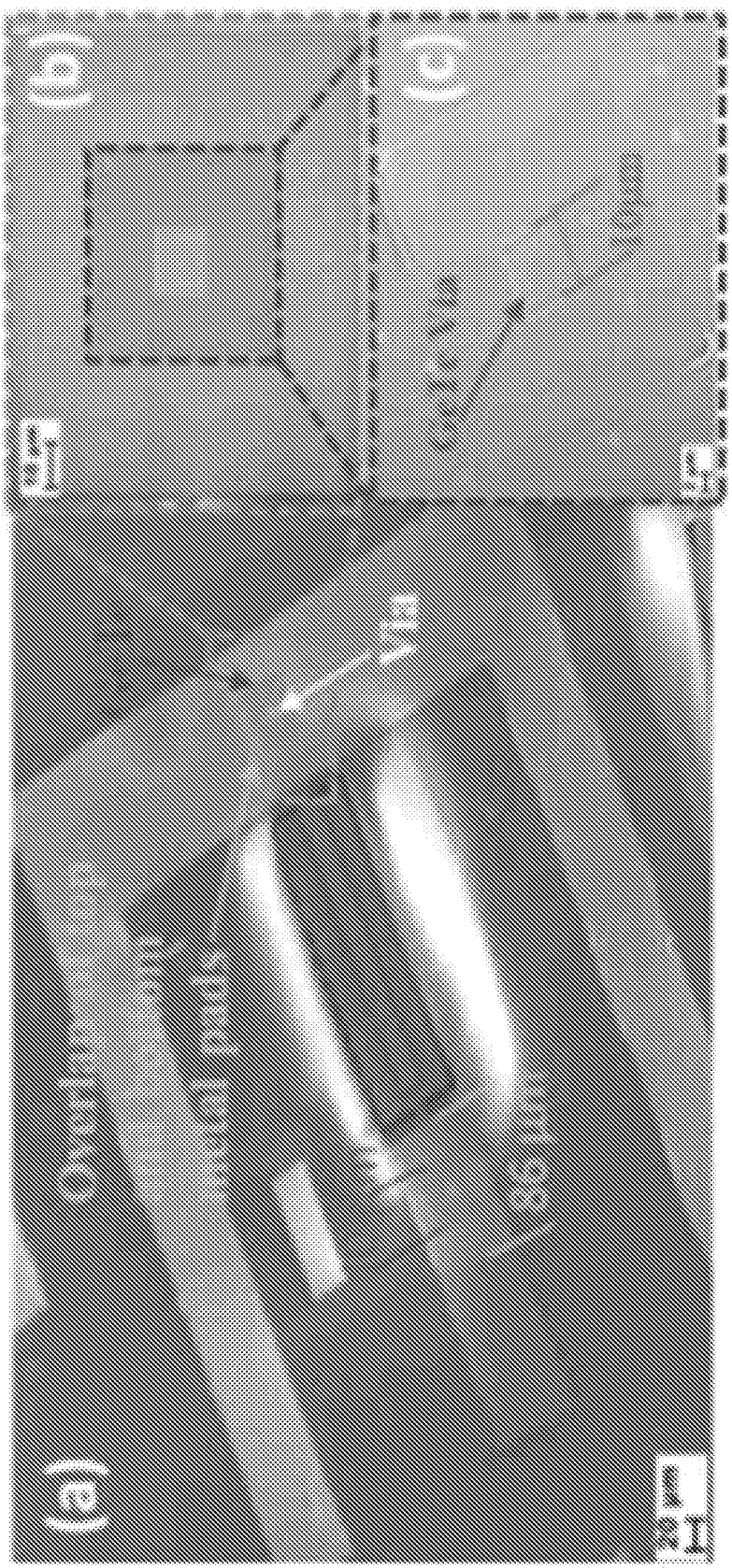
FIG. 9 is a scanning electron microscope (SEM) images of (a) a further embodiment of a MEMS resonator; (b) a closer view of overlap area between top and bottom electrodes around the via; and (c) a closer view of the PCM via.
Figure 10:
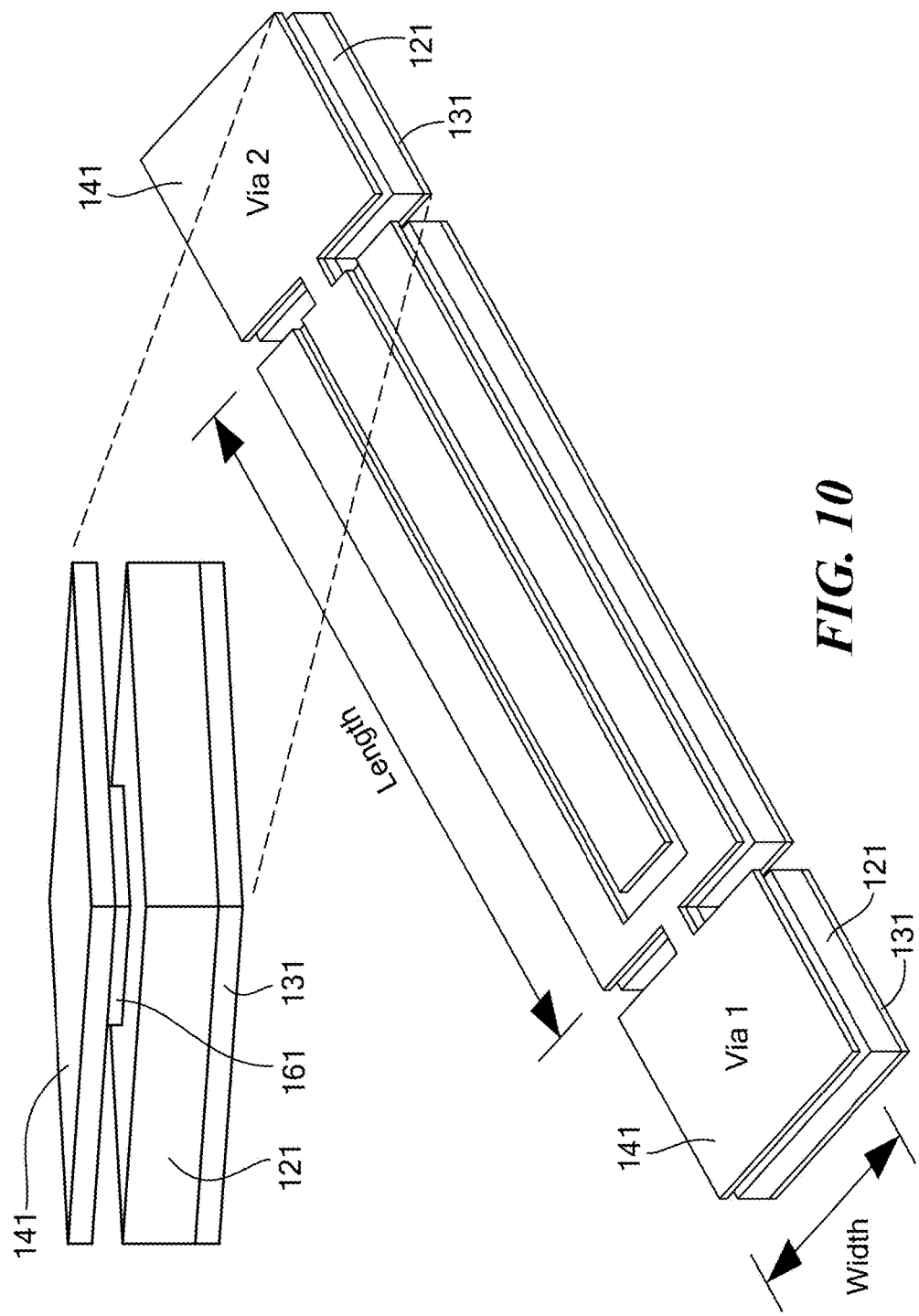
FIG. 10 is a 3D representation of the entire device of the embodiment of FIG. 9 and a closer view of a via.
Figure 11A:
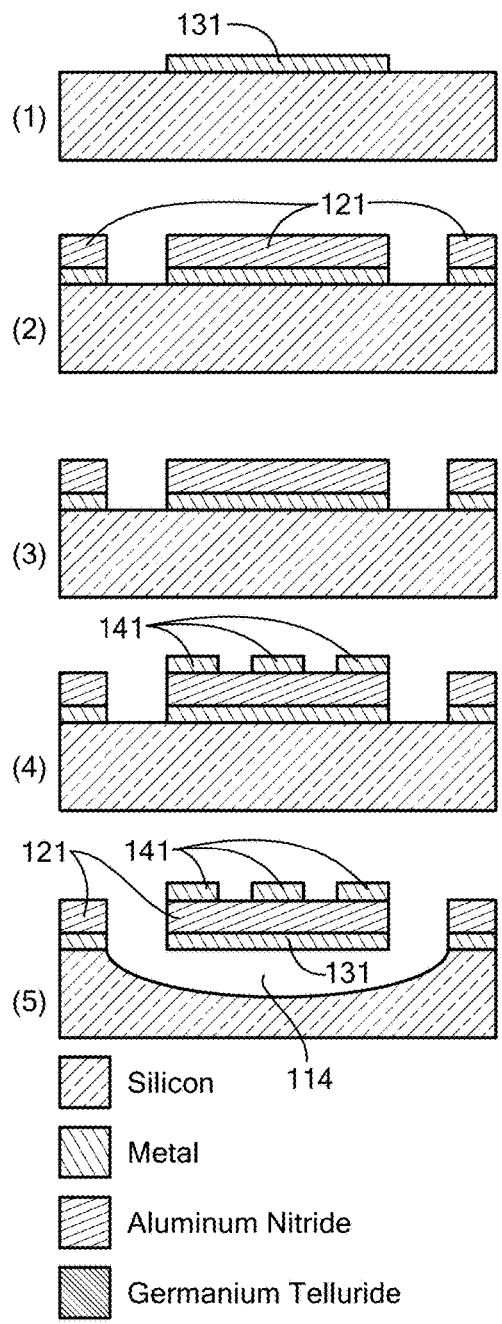
FIGS. 11(a) and (b) are schematic illustrations of an embodiment of a fabrication process flow, in which (a) illustrates a cross section along the device width and (b) illustrates a cross section along the device length. (1) Deposition and lift-off of 100 nm Pt as bottom electrode; (2) Sputter deposition of 500 nm AlN and dry etch to form vias and resonator body; (3) DC pulse sputtering and lift-off of 100 nm PCM; (4) Deposition and lift-off of 250 nm Al as top electrode; (5) Release in $XeF_2$.
Figure 11B:
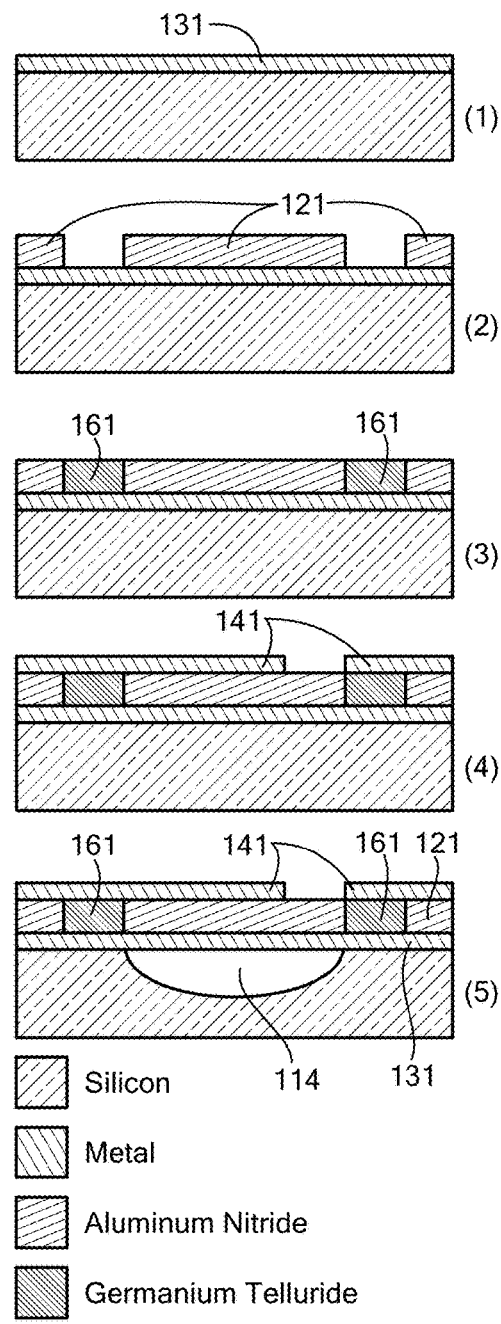
Figures 12A, 12B, 12C:
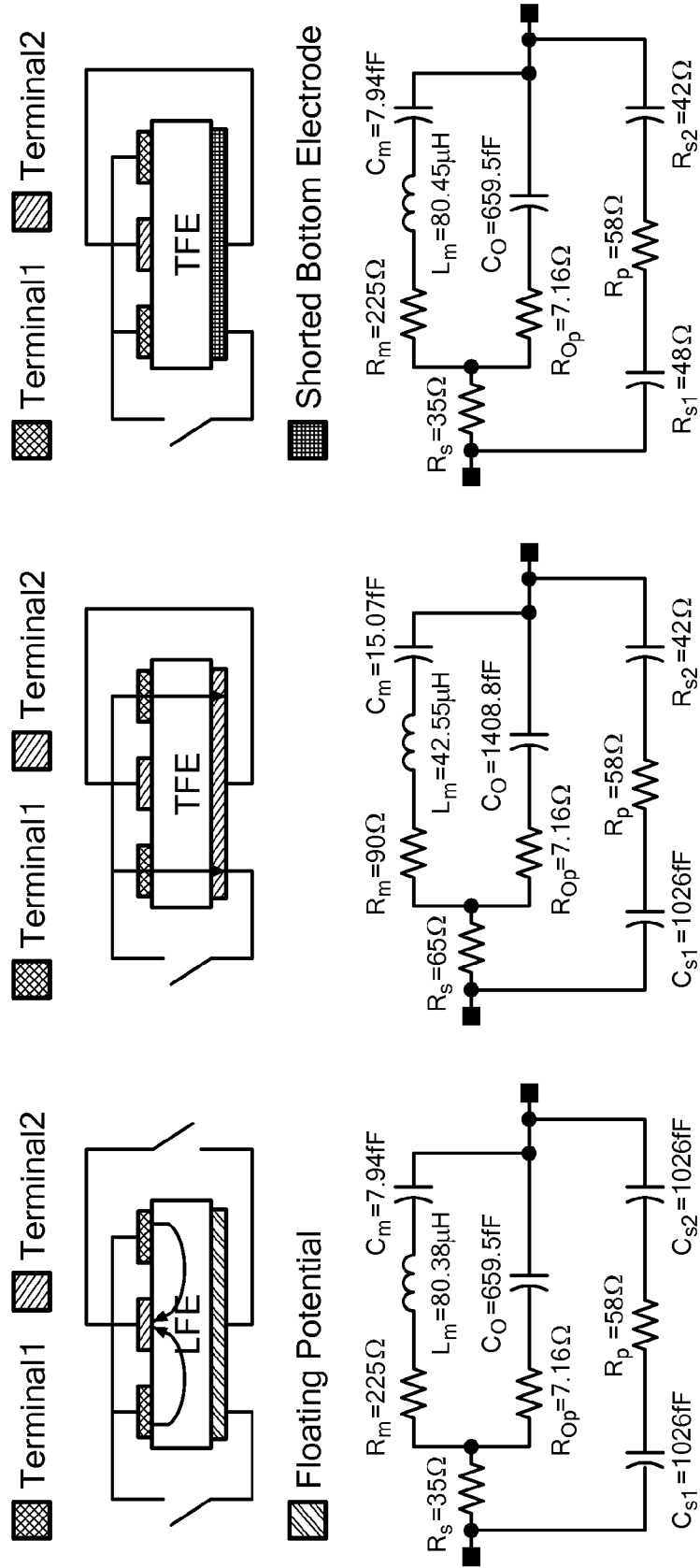
FIG. 12 is a schematic representation of the device terminal connections and equivalent circuit of the reconfigurable resonator in the (a) ON-HI, (b) ON-LI, and (c) SHORT states. $R_p$ represents the resistance of the bottom PT plate. $C_{s1,2}$ and $R_{s1,2}$ are the capacitance/resistance associated with the PCM via switch in the OFF/ON state. $R_s$ is the electrical resistance of the metal lines. $C_0$ and $R_{Op}$ are static capacitance/resistance of the piezoelectric transduce. $R_m$, $C_m$, and $L_m$ represent the motional branch of the resonator. $R_p$ is limited by the large electrical resistivity of the deposited Pt thin-film (~5× the bulk value). Lower values could be achieved by optimizing Pt deposition or by the use of other metals.
Figure 13:
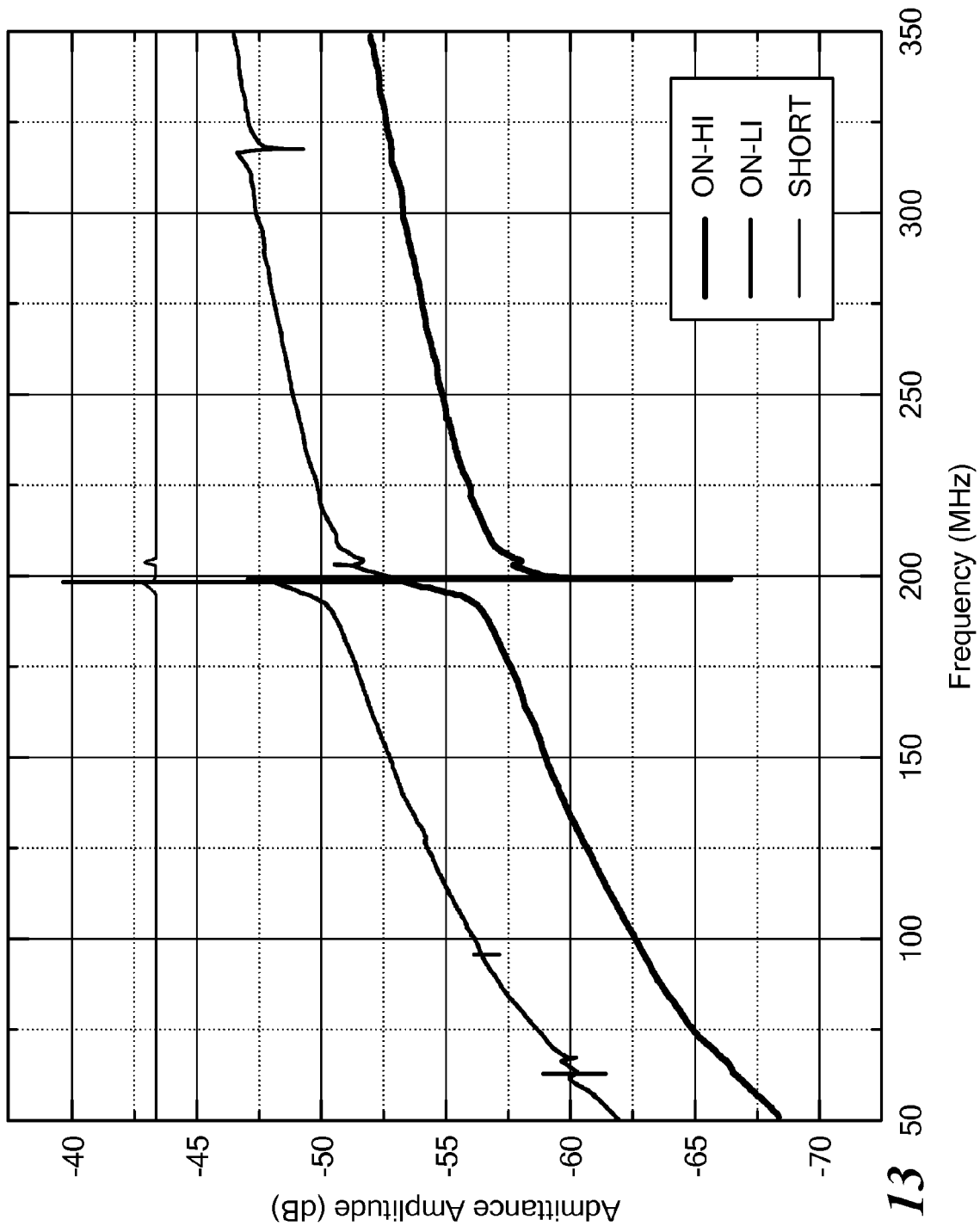
FIG. 13 is a graph illustrating the measured response for all three states of the resonator of FIG. 9.
Figure 14:
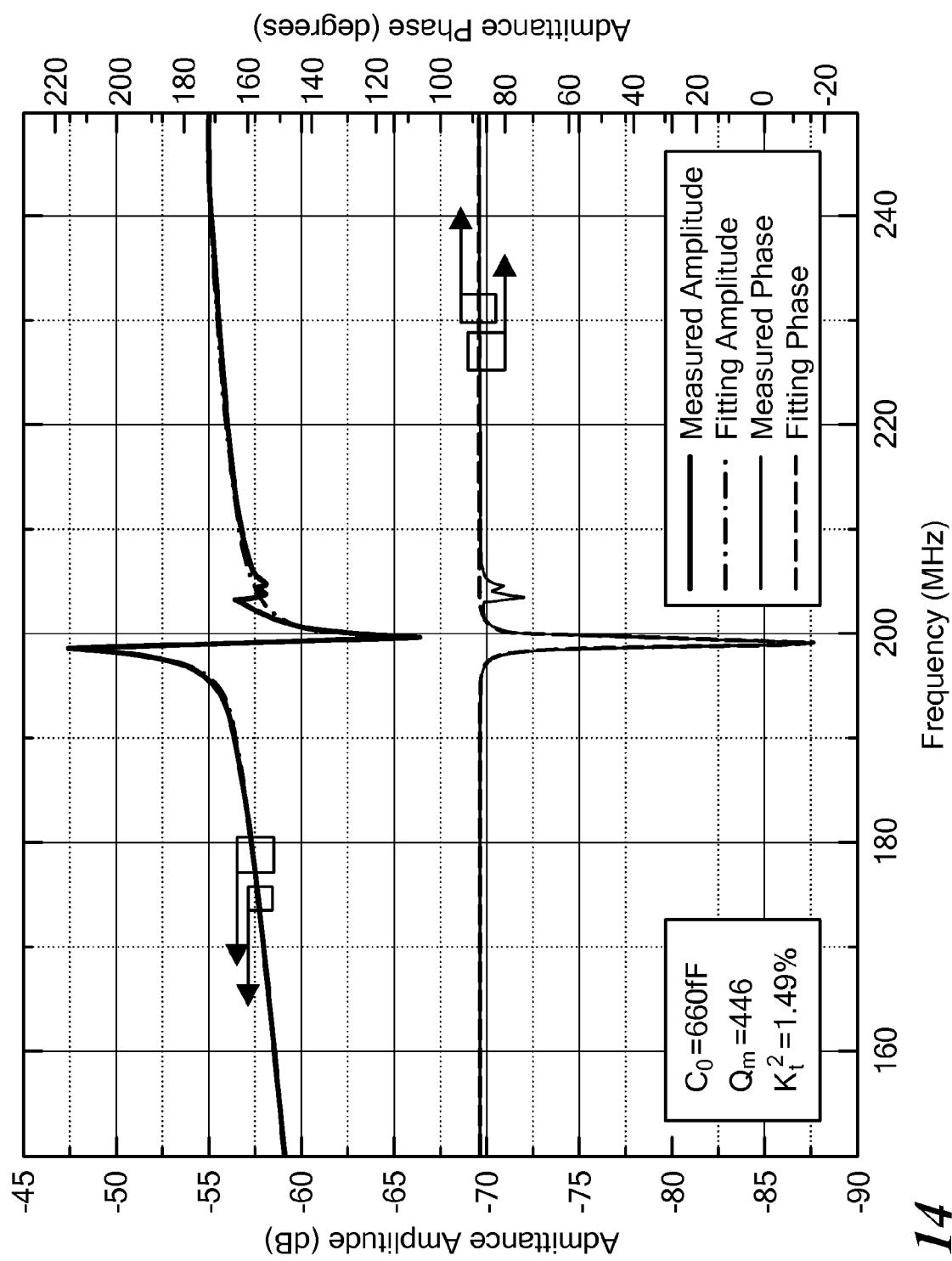
FIG. 14 is a graph of equivalent circuit fitting (FIG. 12(a)) in the ON-HI (both vias OFF) state. The Q of the reconfigurable resonator is comparable to the one of similar static devices fabricated on the same chip.
Figure 15:
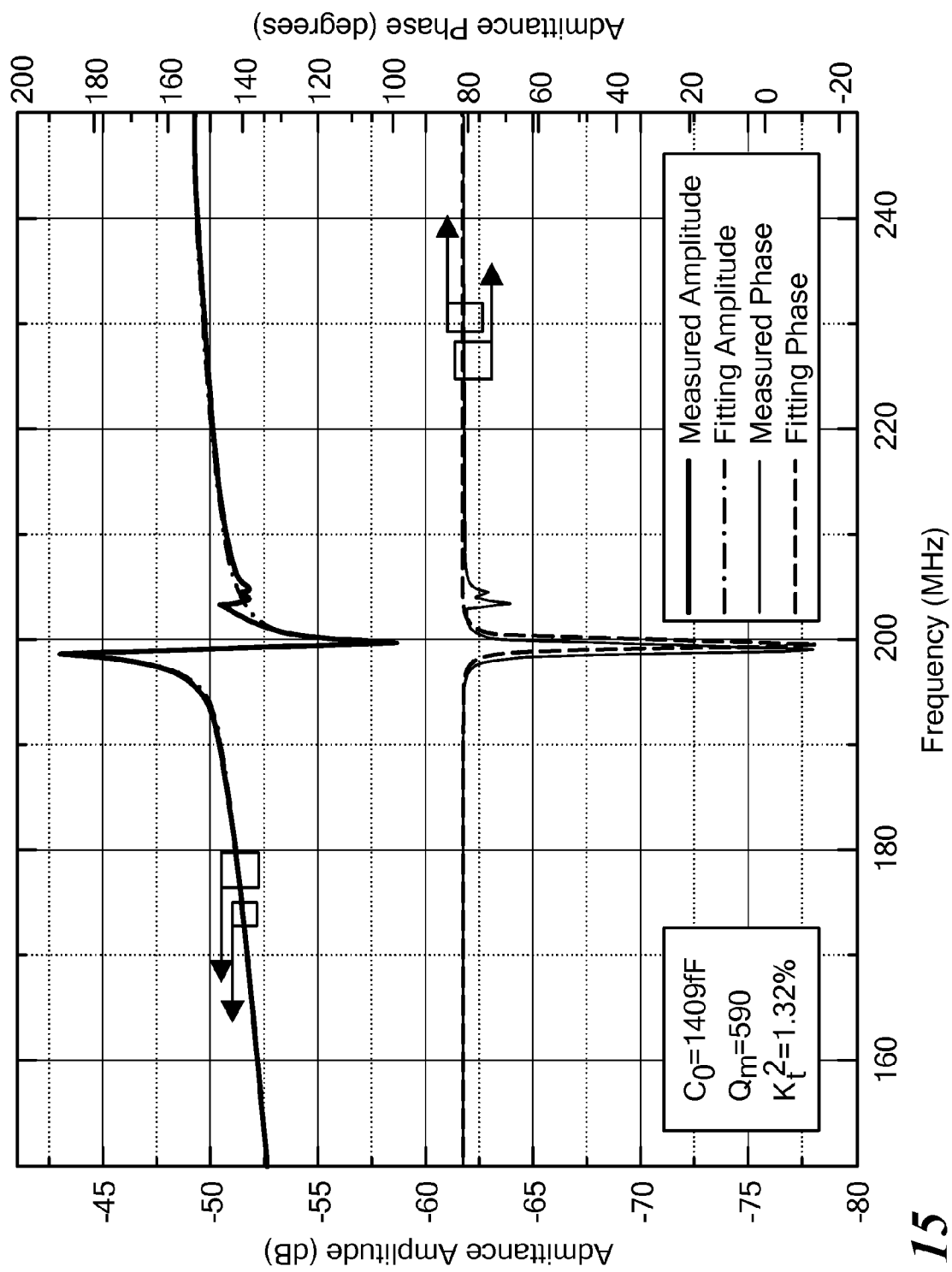
FIG. 15 is a graph of equivalent circuit fitting (FIG. 12(b)) in the ON-LI (via 2 ON) state. The Q of the reconfigurable resonator is comparable to the one of similar static devices fabricated o the same chip.
Figure 16:
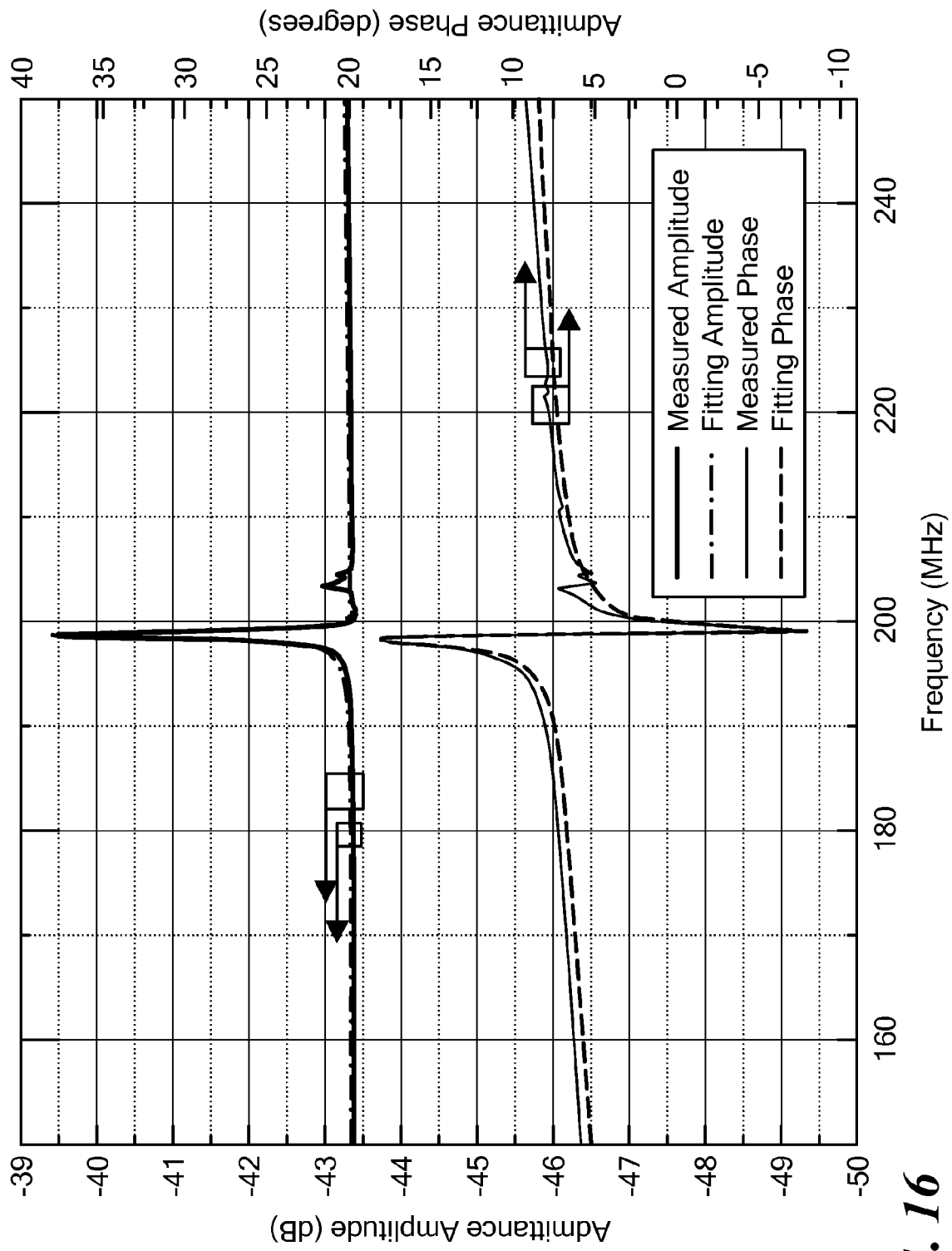
FIG. 16 is a graph of equivalent circuit fitting (FIG. 12(c)) in the SHORT (both vias ON) state. The Q of the reconfigurable resonator is comparable to the one of similar static devices fabricated on the same chip.

The device was tested in a RF probe station and its electrical impedance was measured using a network analyzer. Voltage pulses were applied to the PCM vias in order to switch them ON/OFF. ON state was achieved by applying a 0.1 V pulse with 100 ps duration. OFF state was instead achieved by applying a 0.5 V pulse with 2 μs duration. By programming each of the two vias independently, the device was reconfigured to operate in 3 different states: ON-High Impedance, ON-HI (both vias OFF), ON-Low Impedance, ON-LI (only via 2 ON) and Short (both vias ON). The electrical response of the device was measured for each state (FIG. 13) and fitted to the equivalent circuit models shown in FIG. 12 (values of all the circuit elements were extracted from the measured data). As expected, a relatively high impedance resonance ($C_o \approx 660$ fF; $R_m \approx 225\Omega$) was excited (by means of a lateral field excitation scheme) in the ON-HI state while a relatively low impedance resonance ($C_o \approx 1409$ fF; $R_m \approx 90\Omega$) was excited (by means of the thickness field excitation scheme) in the ON-LI state (note that only 2 top finger electrodes contribute to the TFE) (FIGS. 12(*a*),(*b*) and 14, 15). Also, as anticipated, the impedance of a short circuit was measured in the SHORT state (resonator is shorted by bottom electrode, FIGS. 12(c) and 16). It is worth noting that the electromechanical performance of the resonator ($k_t^2 \cdot Q \approx 7$) was maintained nearly constant (FIGS. 13-16) among the 2 ON states (important feature for implementation of reconfigurable filter architectures). An OFF capacitance of ~1026 fF was extracted for each via. Such large value is due to a non-optimal layout resulting in an extended overlap between the top and bottom metal electrodes across the AlN (FIG. 9). The contribution of the actual 10×10 μm² Ge$_{50}$Te$_{50}$-filled via to the OFF capacitance was estimated to be ~188 fF based on the dielectric constant value (~21.3) reported. ON resistance of ~42Ω (via 2) and ~4812 (via 1) were extracted (limited by non-uniform crystallization of Ge$_{50}$Te$_{50}$ due to the relatively large via size). Lower values of OFF capacitance and ON resistance for through-AlN PCM vias can be achieved by optimization of via size and layout.

Referring to FIGS. 17-22, in a further embodiment, twelve miniaturized (2 μm×2 μm) PCM switches were monolithically integrated with an AlN MEMS resonator and used to reconfigure the terminal connections of the individual metal fingers composing the device interdigital transducer (IDT). This embodiment provides high ON/OFF ratio switching of the acoustic resonance (~28× impedance variation at resonance), and reconfiguration of the device electromechanical coupling ($k_t^2$: 0-1.32%), capacitance (C: 125-1,134 fF), and operating frequency (f1~181.3 MHz, f2~385.4 MHz).

Figure 22:
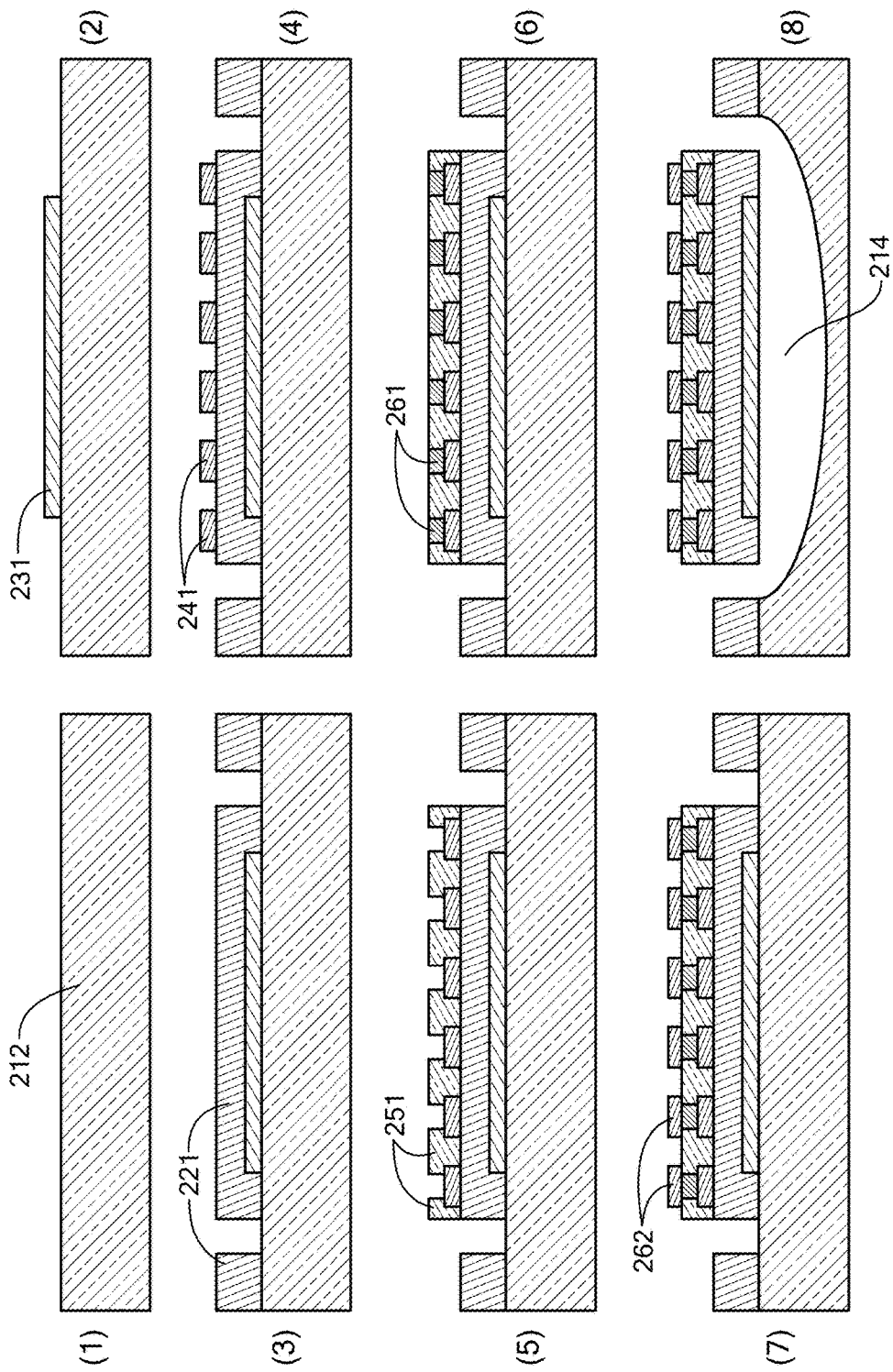
FIG. 22 illustrates a fabrication process flow: (1) Si wafer; (2) Sputter and lift-off of 100 nm Pt; (3) Sputter of 500 nm AlN and dry etch; (4) Sputter and lift-off of 100 nm Al; (5) PECVD deposition and ICP etching of $SiO_2$; (6) DC pulse sputter and lift-off of 100 nm PCM; (7) Sputter and lift-off of 100 nm Cu; (8) Release in $XeF_2$.

This device demonstrates full reconfiguration of the electrode connections to achieve two separate operating frequencies, six separate capacitive states, and a shorted state. The top aluminum interdigital electrode is composed of n=6 metal fingers, fabricated using a simple 6-mask process shown in FIG. 22. FIG. 22 illustrates a fabrication process flow with the following steps: (1) Si wafer 212; (2) Sputter and lift-off of 100 nm Pt electrode 231; (3) Sputter of 500 nm AlN 221 and dry etch; (4) Sputter and lift-off of 100 nm Al electrode 241; (5) PECVD deposition and ICP etching of SiO$_2$ 251; (6) DC pulse sputter and lift-off of 100 nm PCM 261; (7) Sputter and lift-off of 100 nm Cu electrode 262; (8) Release in XeF$_2$ to create cavity 214.

Figure 17:
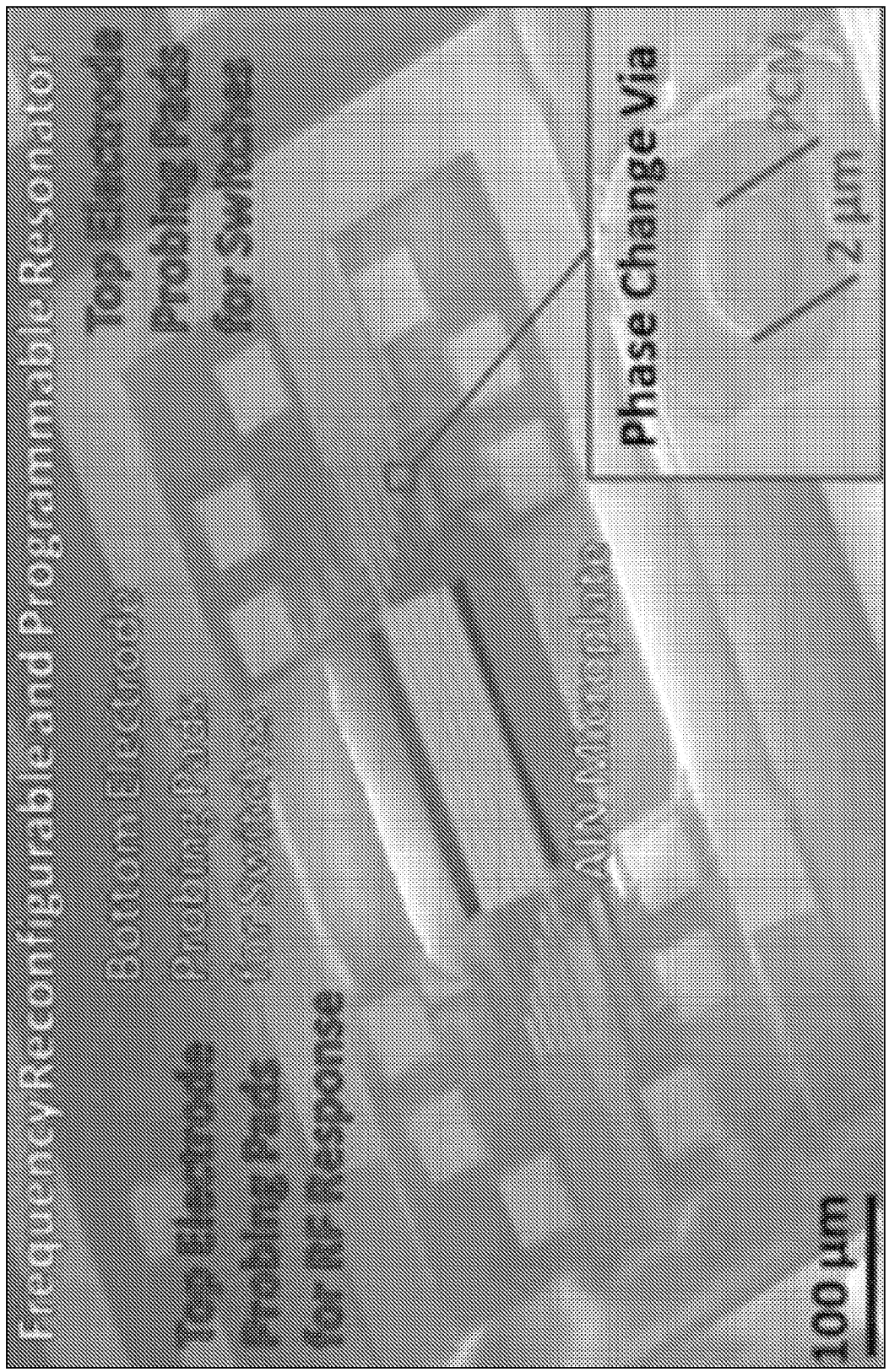
FIG. 17 is a scanning electron microscope (SEM) image of an embodiment of a reconfigurable resonator with probing pads for 12 PCM switches and an exploded image of a single PCM via.
Figure 18:
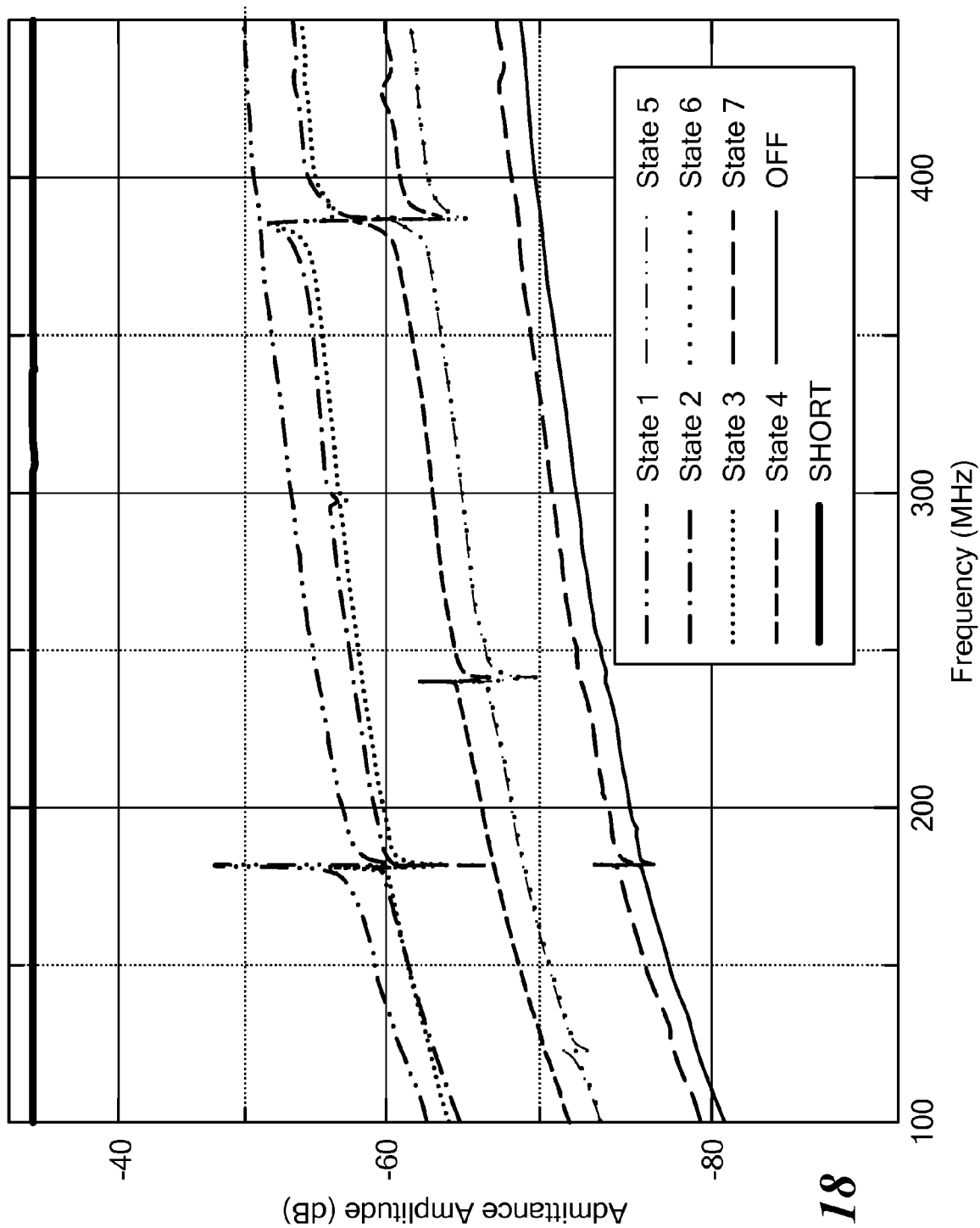
FIG. 18 is a graph of admittance response for nine states achieved for the embodiment of FIG. 17.
Figure 19:
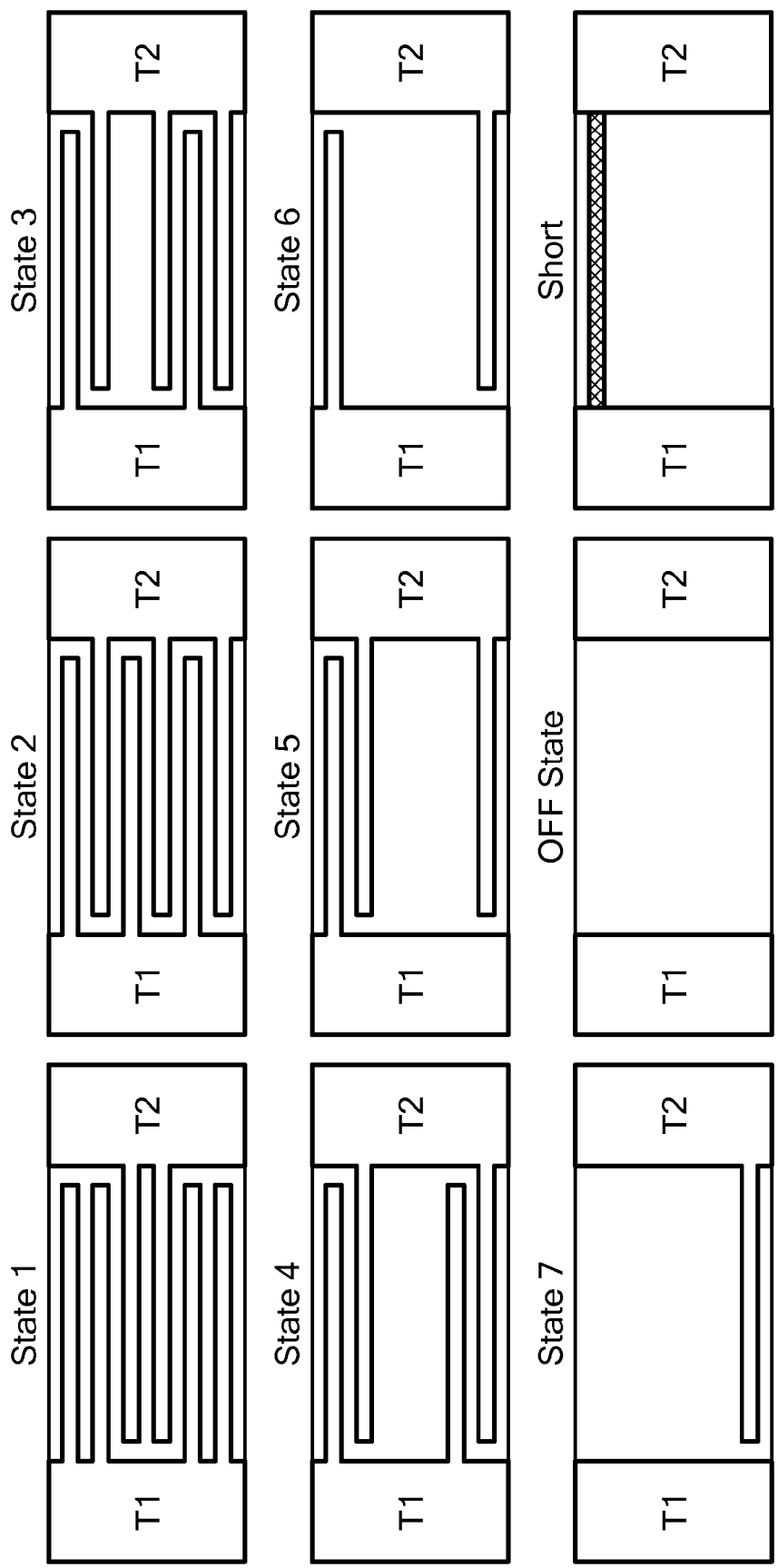
FIG. 19 is a schematic illustration of electrode configurations for nine different experimentally obtained states for the embodiment of FIG. 17.
Figure 20A:
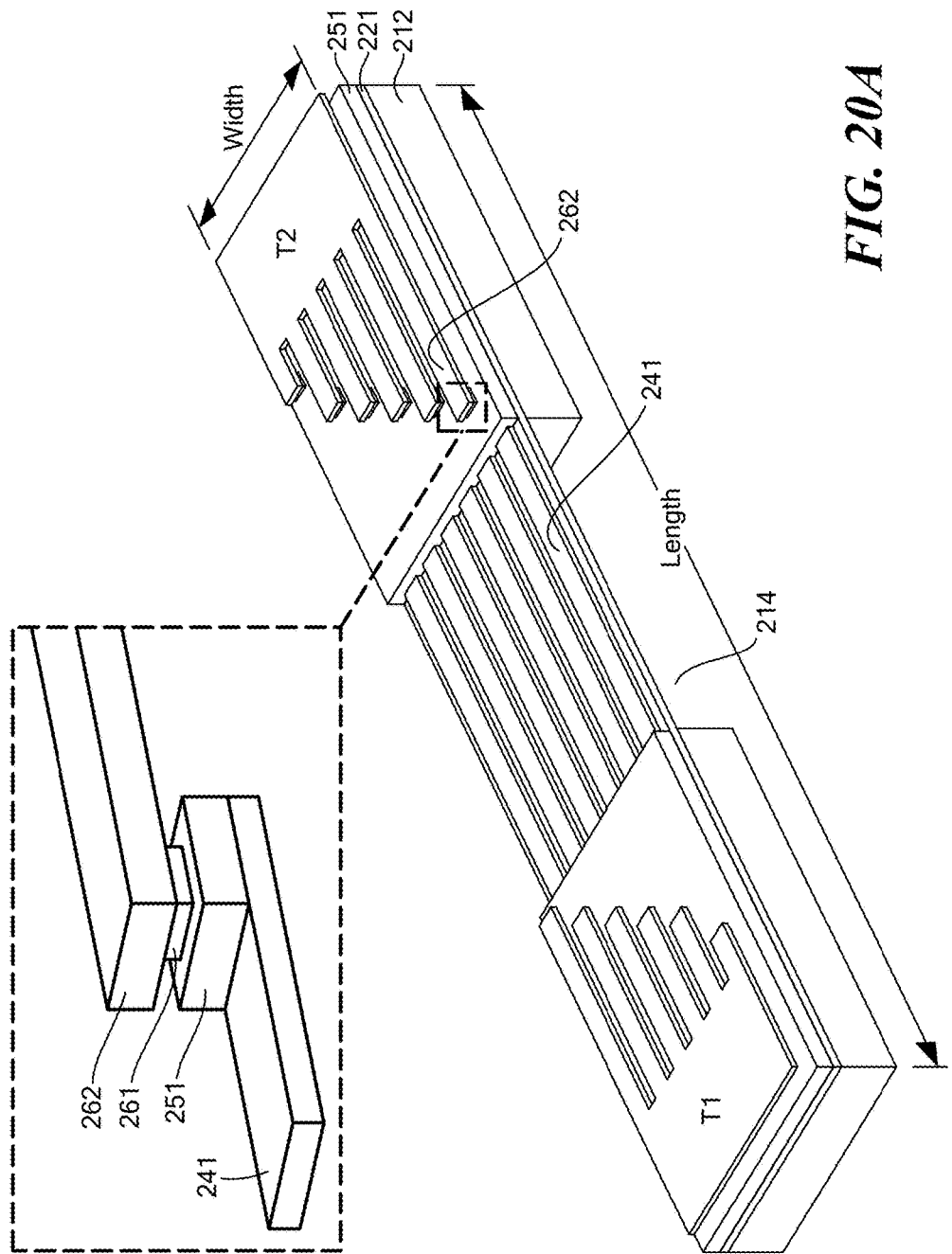
FIG. 20(a) is a 3D schematic image of a reconfigurable resonator.
Figure 20B:
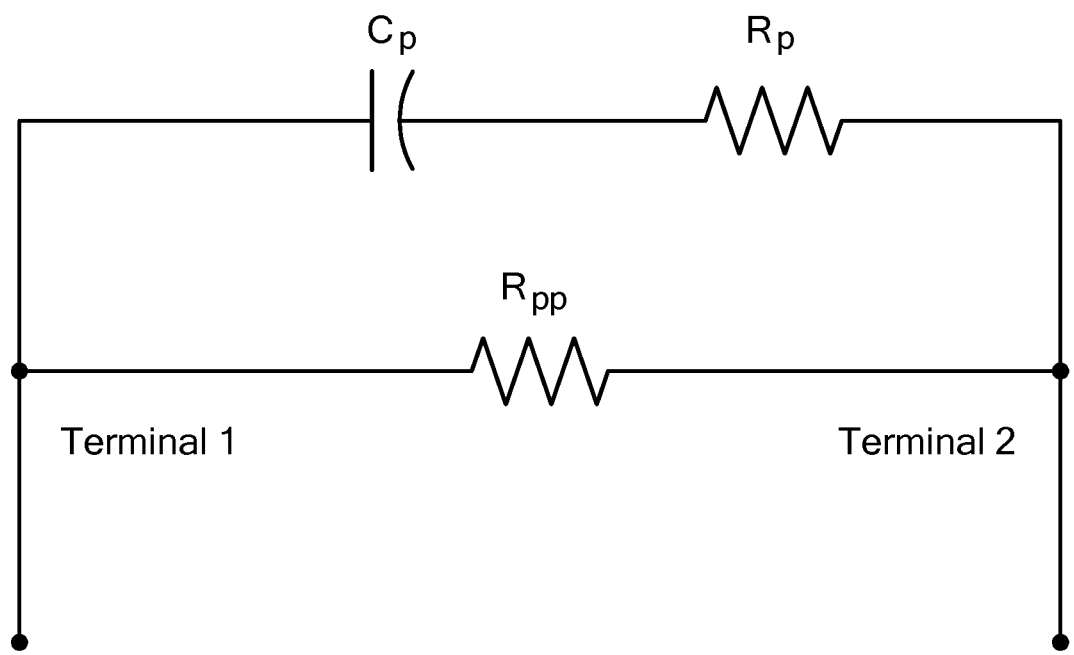
FIGS. 20(b) and (c) are equivalent circuit models of the device of FIG. 20(a), in which $c_p$, $R_p$, and $R_{pi}$, represent the high impedance path between resonator terminals created by the total capacitance associated with the combination of PCM via switches in the OFF state and other parasitics. $R_s$, (~2Ω) is the loss introduced by the combination of PCM vias in the ON state; note that $R_s$ has minimal effect on resonator performance. $C_0/R_{Op}$ are static capacitance/resistance of the piezoelectric transducer. $R_m$, $D_m$, and $L_m$ represent the motional branch of the resonator.
Figure 20C:
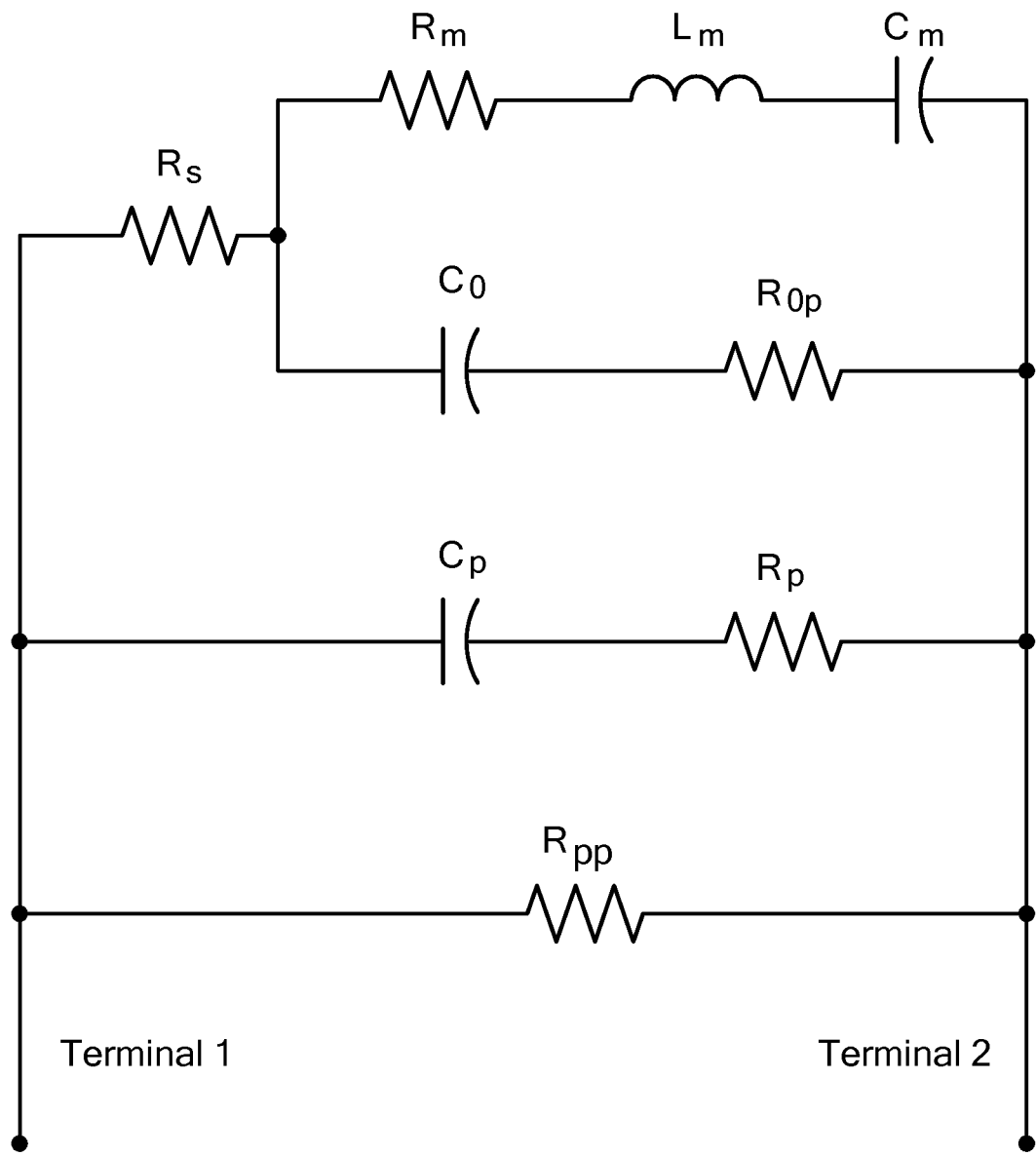
Figure 21A:
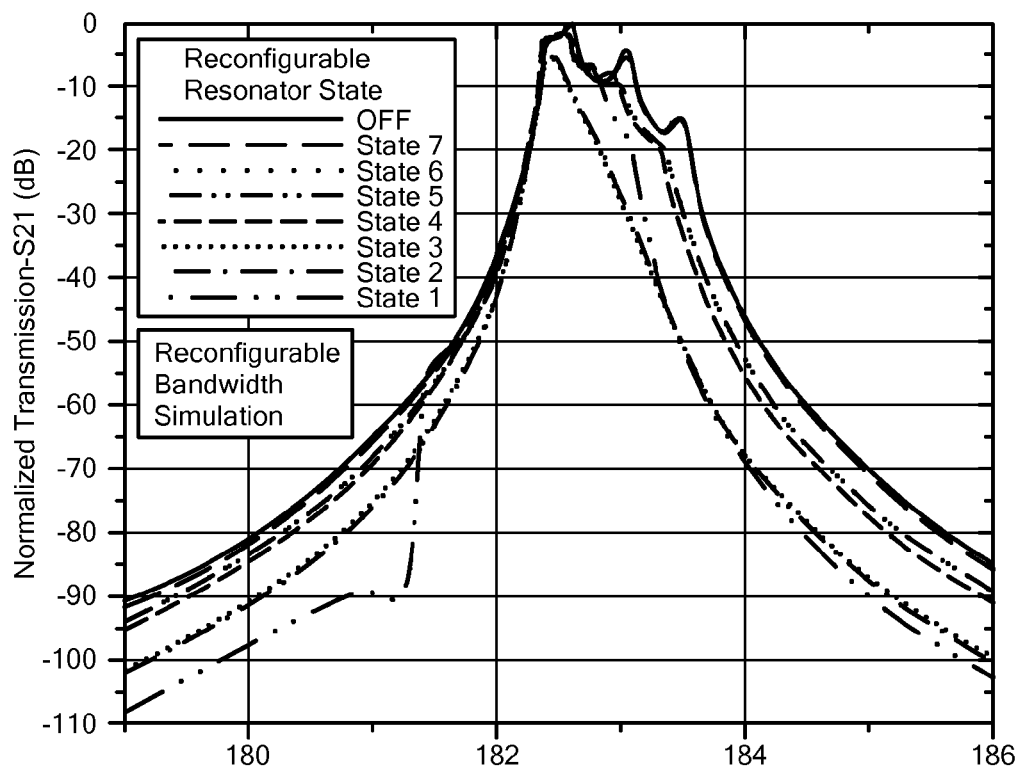
FIG. 21 illustrates a simulated response of $4^{th}$ order filter based on architecture shown. (a) Reconfigurable filter bandwidth using experimental variable capacitance and frequency states (illustrated in FIG. 18). (b) Reconfigurable filter roll-off using experimental variable capacitance states (illustrated in FIG. 18) for RES 2. Filter bandwidth can be adjusted by reconfiguring the static capacitance of RES 3 when its operating frequency is set to be far from the filter passband (385 MHz, States OFF, 2-7 in (a, FIG. 18). Filter roll-off can be adjusted by reconfiguring RES 3 to operate at a frequency close to the filter passband (181 MHz) which introduces a zero in the filter transfer function (Stage 1 in (a, FIG. 18). (c) Architecture of the 4th order filter.
Figure 21B:
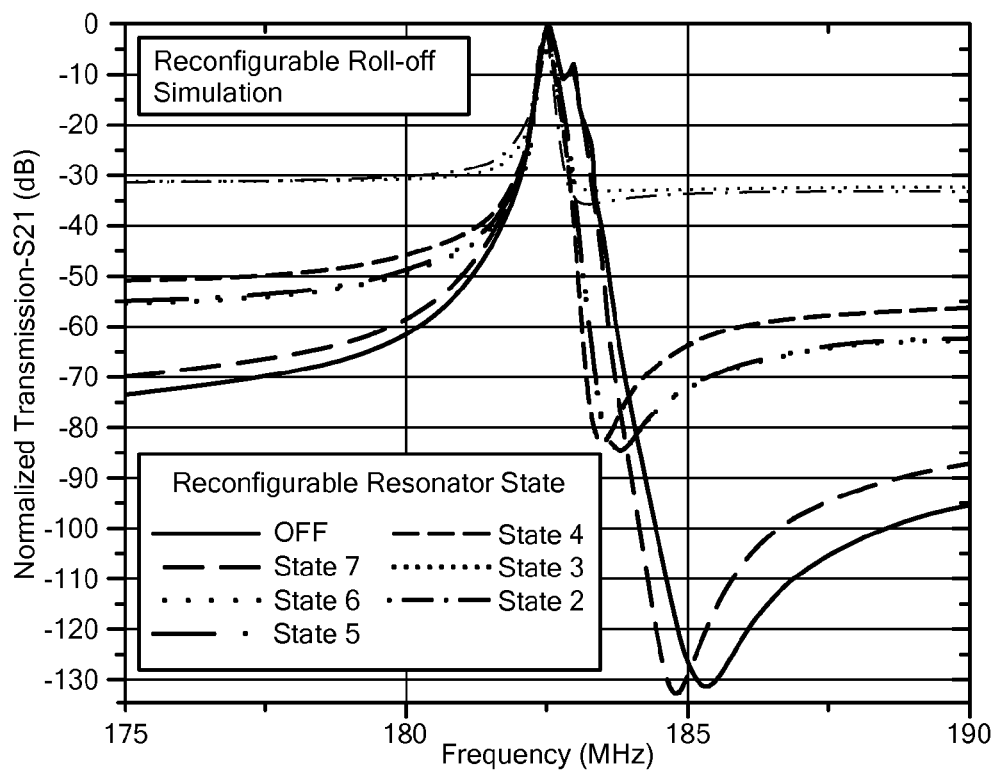
Figure 21C:
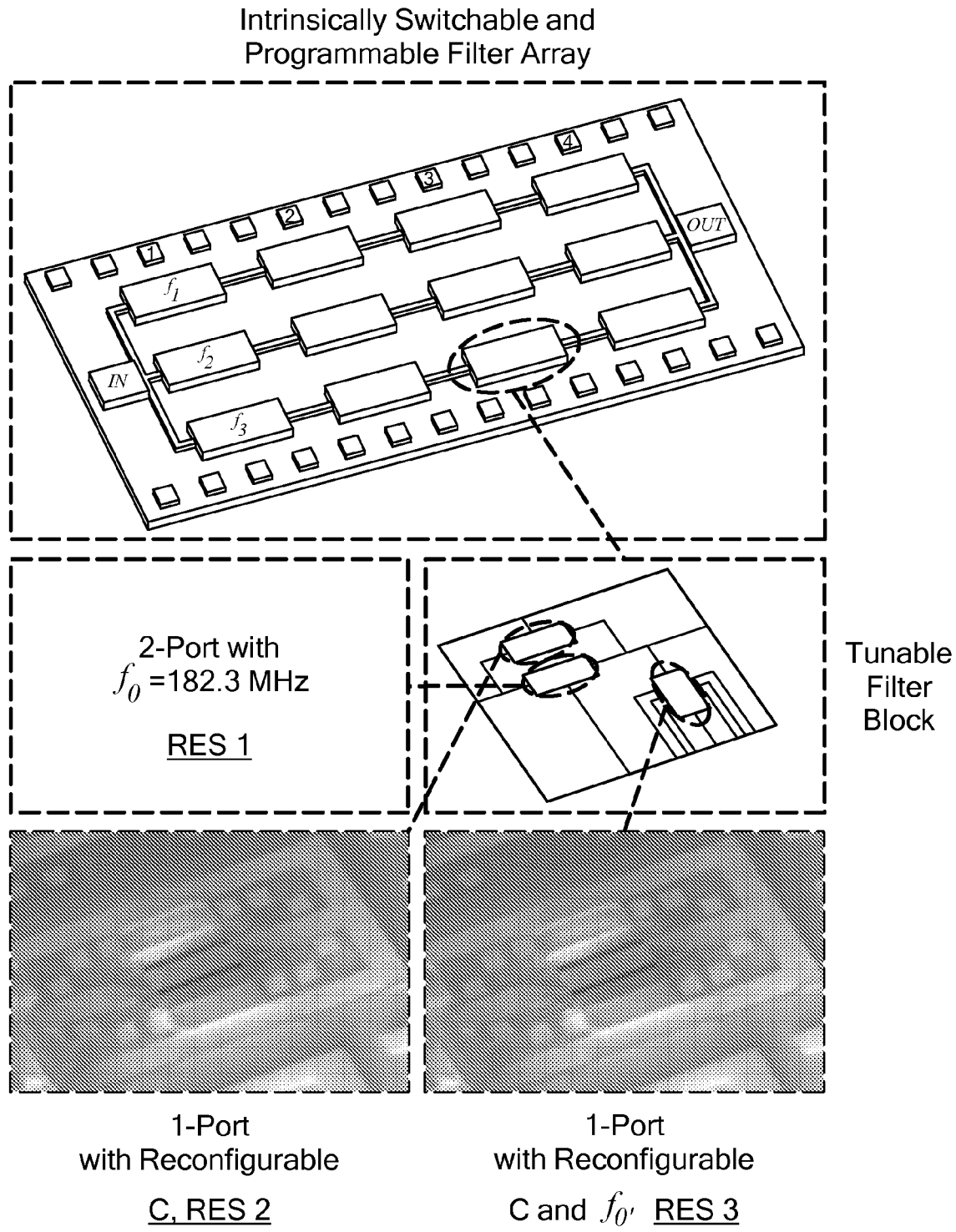

In this embodiment, the IDT fingers completely cover the resonant body of the device, extending up to the anchoring regions, where they are overlapped by the electrical terminal of the resonator, separated by a SiO$_2$ insulating layer. Twelve 2 μm×2 μm Ge$_{50}$Te$_{50}$ PCM vias are used to connect the six metal fingers of the interdigital electrode to the device terminals, as shown in FIG. 17. By independently programming each of the PCM vias, the terminal connections of the IDT are reconfigured to produce the nine separate states.

The transition temperatures for ON/OFF switching of the PCM vias were achieved by applying voltage pulses to pass current directly through the PCM (direct heating). To transition from the amorphous (OFF) state to the crystalline (ON) state, a pulse of 0.5V amplitude, 2 μs duration, and 5 ns rise/fall was used to achieve an ON resistance of ~2Ω for an individual 2 μm×2 μm PCM via switch. To switch from the ON state to the OFF state (with an extracted $C_{OFF}$~20 fF), a pulse of 1V amplitude, 2 μs duration, and 5 ns rise/fall was used. The reconfigurable resonator was programmed to operate in nine states (FIGS. 18, 19, Table 2): State 1 (6 vias ON, $6^{th}$ order contour-extensional mode of vibration, $f_1$=181.3 MHz, C~1,135 fF, $k_t^2$~1.24%), State 2 (6 vias ON, $3^{rd}$ order contour-extensional mode of vibration, $f_2$=385.4 MHz, C~715 fF, $k_t^2$~1.32%), States 3-7 (1-5 vias ON, 125 fF<C<635 fF), and OFF (all vias OFF). It is worth noting that fairly constant electromechanical coupling coefficient, $k_t^2$, was achieved for the two different operating frequencies (State 1,2). The extracted equivalent circuit of the fabricated device was used to simulate the response of an AlN/PCM filter architecture with reconfigurable bandwidth and roll-off (FIG. 21), demonstrating the ability of the integration of PCM with piezoelectric MEMS resonators for the implementation of single chip, multi-band reconfigurable RF systems.

TABLE 2

Frequency and Capacitance Values for Reconfigurable States

| State | 1 | 2 | 3 | 4 | 5 | 6 | 7 | OFF |
|---|---|---|---|---|---|---|---|---|
| $f_s$ | 181 | 385 | 385 | 386 | 386 | 386 | — | — |
| $C_o$(fF) | 1134 | 714 | 634 | 364 | 290 | 288 | 153 | 125 |

Reconfigurable resonators can be combined to form a filter platform that covers all or most of the available spectrum between 10 s MHz and 10 s GHz for reconfigurable wireless communication devices. These devices can eliminate the need to acquire multiple components—potentially from multiple vendors—to address the variations of frequency necessary for applications such as modern cellphones. A single component can be used for multiple functionalities, therefore saving costs in acquisition and in assembly of parts. For example, in modern cell phones, the acoustic RF filters are purchased as individually packaged components from different vendors and then assembled on a board. If new cellular bands become available, the produced tunable filter solutions will be able to be dynamically reconfigured to address the new needs without having to retire or replace any components.

A single filter platform, formed using the present reconfigurable resonators, can be produced for various radio front-end applications. After installation, the frequency can be adjusted to fit the requirements of the particular radio design. This flexibility eliminates the necessity to shop different vendors for different frequencies. A single platform can be created for multiple possible frequencies, with a similar cost and size for all those possible frequencies. This also permits the adjustment of the operating frequency of the radio design without obtaining new components. This can be useful for such applications as Amateur Home Radio setups; as users advance their license levels and gain access to new frequencies, they can tune their current setup to accommodate their new permitted communication bands.

Tunable capacitors are popular in use with current RF MEMS technology to adjust the impedance of a circuit setup and aid in the compatibility with integrated IC designs. The integration of phase change switches and piezoelectric MEMS resonators results in the combination of a resonator and a tunable capacitance in a single device. The tunable capacitance capability can be utilized to adjust the matching impedance of a filter network with integrated IC components of such applications as radio front end architectures.

It will be appreciated that the various features of the embodiments described herein can be combined in a variety of ways. For example, a feature described in conjunction with one embodiment may be included in another embodiment even if not explicitly described in conjunction with that embodiment.

The present invention has been described in conjunction with certain preferred embodiments. It is to be understood that the invention is not limited to the exact details of construction, operation, exact materials or embodiments shown and described, and that various modifications, substitutions of equivalents, alterations to the compositions, and other changes to the embodiments disclosed herein will be apparent to one of skill in the art.

What is claimed is:

1. A micro-electro-mechanical system (MEMS) resonator, comprising:
   a substrate, a first electrode supported by the substrate, a second electrode supported by the substrate, and terminal connections to the first electrode and the second electrode;
   a piezoelectric material between the first electrode and the second electrode; and
   a phase change material disposed to control the terminal connections to the electrodes, and comprising one or more switches operable between an ON state and an OFF state;
   wherein application of heat to the phase change material causes the phase change material to change from an amorphous state to a crystalline state or from a crystalline state to an amorphous state, the amorphous state and the crystalline state each associated with one of the ON state and the OFF state.

2. The MEMS resonator of claim 1, wherein the first electrode comprises a bottom plate electrode supported from an anchor region above a cavity in the substrate, and the second electrode comprises a top interdigital electrode spaced from the first electrode, the top interdigital electrode comprising a plurality of fingers, and the one or more switches comprise a plurality of switches, each switch associated with one of the fingers of the top electrode.

3. The MEMS resonator of claim 1, wherein the phase change material is disposed to control connections between the first electrode and the second electrode.

4. The MEMS resonator of claim 2, wherein each of the switches comprises via between each of the fingers of the second electrode and the terminal connection to the second electrode.

5. The MEMS resonator of claim 1, wherein the phase change material is disposed to control connections within a layer by bridging a gap between the first electrode and the second electrode.

6. The MEMS resonator of claim 1, wherein each switch is operable to turn ON upon application of a first voltage pulse having a first voltage and a first duration and is operable to turn OFF upon application of a second voltage pulse having a second voltage and a second duration, the second voltage greater than the first voltage and the second duration shorter than the first duration.

7. The MEMS resonator of claim 1, wherein each switch of the one or more switches is independently operable to change from the amorphous state to the crystalline state or from the crystalline state to the amorphous state.

8. The MEMS resonator of claim 1, wherein each switch of the one or more switches is independently programmable to enable one or more of frequency programming of the MEMS resonator, capacitance tuning of the MEMS resonator, shorting of the resonator, and ON/OFF switching of the MEMS resonator.

9. The MEMS resonator of claim 1, wherein each switch of the one or more switches is in electrical communication with the terminal connections for electrical connection to a voltage source and ground, whereby voltage pulses can be applied to each switch to effect a phase change from the amorphous state to the crystalline state or from the crystalline state to the amorphous state.

10. The MEMS resonator of claim 1, wherein each switch of the one or more switches is operable by laser to effect a phase change from the amorphous state to the crystalline state or from the crystalline state to the amorphous state.

11. The MEMS resonator of claim 1, wherein each switch of the one or more switches is operable by pressure to effect a phase change from the amorphous state to the crystalline state or from the crystalline state to the amorphous state.

12. The MEMS resonator of claim 1, wherein each switch of the one or more switches is in electrical communication between radio frequency signal electrodes, with an external heater in electrical communication with the terminal connections for electrical connection to a voltage source and ground, whereby voltage pulses applied to the external heater transfer heat to each switch to effect a phase change from the amorphous state to the crystalline state or from the crystalline state to the amorphous state.

13. The MEMS resonator of claim 6, wherein the voltage pulses range from 0.01 to 25 V.

14. The MEMS resonator of claim 1, wherein the phase change material comprises germanium telluride.

15. The MEMS resonator of claim 1, wherein the phase change material comprises a chalcogenide material.

16. The MEMS resonator of claim 1, wherein the piezoelectric material comprises aluminum nitride.

17. The MEMS resonator of claim 1, further comprising an insulating material surrounding the phase change material, between the piezoelectric material and the phase change material, between the phase change material and an external heater, or between the phase change material and both the piezoelectric material and an external heater.

18. The MEMS resonator of claim 1, wherein the piezoelectric material comprises an insulating material.

19. A method of fabricating the MEMS resonator of claim 1, comprising:
   providing a semiconductor substrate;
   forming the first electrode comprising a metal layer supported above the substrate;
   forming a resonant body comprising the piezoelectric material over the first electrode;
   providing the phase change material over the resonant body; and
   forming the second electrode comprising a metal material over the phase change material.

20. A reconfigurable filter system comprising the MEMS resonator of claim 1, wherein at least one of frequency, impedance, capacitance, bandwidth, roll-off, and band selection of the filter system can be reconfigured by operation of the MEMS resonator.

* * * * *